United States Patent [19]
Glezer et al.

[11] Patent Number: 5,988,522
[45] Date of Patent: *Nov. 23, 1999

[54] SYNTHETIC JET ACTUATORS FOR MODIFIYING THE DIRECTION OF FLUID FLOWS

[75] Inventors: Ari Glezer, Atlanta; Barton L. Smith, Decatur, both of Ga.

[73] Assignee: Georgia Tech Research Corporation, Atlanta, Ga.

[ * ] Notice: This patent is subject to a terminal disclaimer.

[21] Appl. No.: 08/869,716

[22] Filed: Jun. 5, 1997

Related U.S. Application Data

[63] Continuation of application No. 08/489,490, Jun. 12, 1995, Pat. No. 5,758,823.

[51] Int. Cl.[6] .................................................... B05B 7/16
[52] U.S. Cl. ............................................. 239/11; 239/418
[58] Field of Search ............................. 239/102.1, 4, 11, 239/327, 333, 332, 329, 101, 99, 418, 423; 222/212, 210

[56] References Cited

U.S. PATENT DOCUMENTS

| | | | |
|---|---|---|---|
| 2,761,833 | 9/1956 | Ward | 222/212 |
| 2,812,636 | 11/1957 | Kadosch et al. | 239/310 |
| 4,611,553 | 9/1986 | Iwata | 118/50 |
| 4,646,945 | 3/1987 | Steiner | 222/213 X |
| 4,747,523 | 5/1988 | Dobbs | 239/333 X |
| 5,238,153 | 8/1993 | Castillo et al. | 222/212 X |
| 5,758,823 | 6/1998 | Glezer et al. | 239/4 |

*Primary Examiner*—Kevin Weldon
*Attorney, Agent, or Firm*—Thomas, Kayden, Horstemeyer & Risley

[57] ABSTRACT

In a first preferred embodiment for an improved synthetic jet actuator, the orifice shape is altered by either a flap or adjusting the housing walls. If the flap is deployed outward from the wall just above the orifice of a synthetic jet actuator, the synthetic jet flow will be vectored upward, toward the flap. Similarly, if the upper wall forming the orifice is moved outward from the jet chamber interior with respect to an opposing wall forming the orifice, the flow will also vector upward. In the second preferred embodiment of an improved synthetic jet actuator, an opening in addition to the orifice, may be formed in one or more walls of the housing. A louver is aligned with the opening in the housing and permits fluid flow in only one direction, either into the chamber or out of the chamber. When the louver permits fluid flow into the chamber, the jet actuator can operate at high speeds since fluid can enter the chamber through a greater surface area. Another preferred embodiment for an improved synthetic jet actuator comprises two concentric tubular sections normal to an outside surface of a solid body). In operation, the innermost section is connected to a vacuum device and constantly pulls fluid down its length from the ambient fluid above the outer surface. Meanwhile, the outer section ejects fluid into the ambient environment by pulses. Such an operation will cause a synthetic fluid jet to form above the constant suction synthetic jet actuator.

35 Claims, 18 Drawing Sheets

SYNTHETIC JET ACTUATORS FOR MODIFIYING THE DIRECTION OF FLUID FLOWS

RELATED APPLICATION

This application is a continuation of application Ser. No. 08/489,490, filed on Jun. 12, 1995 now U.S. Pat. No. 5,758,823.

The U.S. Government has a paid up license in this invention and the right in limited circumstances to require the patent owner to license others on reasonable terms as provided for by the terms of Contract No. F49620-92-J-0518, awarded by the United States Air Force, Office of Scientific Research.

FIELD OF THE INVENTION

The present invention generally relates to fluid actuators for manipulation and control of fluid flow and, more particularly, to improved synthetic jet actuators generating a train of vortices for producing a stream of fluid which affects a fluid flow field without net mass injection into the flow field.

BACKGROUND OF THE INVENTION

The ability to manipulate and control the evolution of shear flows has tremendous potential for influencing system performance in diverse technological applications, including: mixing and combustion processes, lift and drag of aerodynamic surfaces, and thrust management. That these flows are dominated by the dynamics of a hierarchy of vortical structures, evolving as a result of inherent hydrodynamic instabilities (e.g., Ho & Huerre, 1984), suggests control strategies based on manipulation of these instabilities by the introduction of small disturbances at the flow boundary. A given shear flow is typically extremely receptive to disturbances within a limited frequency band and, as a result, these disturbances are rapidly amplified and can lead to substantial modification of the base flow and the performance of the system in which it is employed.

There is no question, that suitable actuators having fast dynamic response and relatively low power consumption are the foundation of any scheme for the manipulation and control of shear flows. Most frequently, actuators have had mechanically moving parts which come in direct contact with the flow [e.g., vibrating ribbons (Schubauer & Skramstad *J. Aero Sci.* 14 1947), movable flaps (Oster & Wygnanski, 1982), or electromagnetic elements (Betzig *AIAA*, 1981)]. This class of direct-contact actuators also includes piezoelectric actuators, the effectiveness of which has been demonstrated in flat plate boundary layers (Wehrmann 1967, and Jacobson & Reynolds *Stan. U. TF*-64 1995), wakes (Wehrmann *Phys. Fl.* 8 1965, 1967, and Berger *Phys. Fl. S*191 1967), and jets (Wiltse & Glezer 1993). Actuation can also be effected indirectly (and, in principle, remotely) either through pressure fluctuations [e.g., acoustic excitation (Crow & Champagne *JFM* 48 1971)] or body forces [e.g., heating (Liepmann et al. 1982, Corke & Mangano *JFM* 209 1989, Nygaard and Glezer 1991), or electromagnetically (Brown and Nosenchuck, *AIAA* 1995)].

Flow control strategies that are accomplished without direct contact between the actuator and the embedding flow are extremely attractive because the actuators can be conformally and nonintrusively mounted on or below the flow boundary (and thus can be better protected than conventional mechanical actuators). However, unless these actuators can be placed near points of receptivity within the flow, their effectiveness degrades substantially with decreasing power input. This shortcoming can be overcome by using fluidic actuators where control is effected intrusively using flow injection (jets) or suction at the boundary. Although these actuators are inherently intrusive, they share most of the attributes of indirect actuators in that they can be placed within the flow boundary and require only an orifice to communicate with the external flow. Fluidic actuators that perform a variety of "analog" (e.g., proportional fluidic amplifier) and "digital" (e.g., flip-flop) throttling and control functions without moving mechanical parts by using control jets to affect a primary jet within an enclosed cavity have been studied since the late 1950's (Joyce, *HDL-SR* 1983). Some of these concepts have also been used in open flow systems. Viets (*AIAA J.* 13 1975) induced spontaneous oscillations in a free rectangular jet by exploiting the concept of a flip-flop actuator and more recently, Raman and Cornelius (*AIAA J.* 33 1995) used two such jets to impose time harmonic oscillations in a larger jet by direct impingement.

More recently, a number of workers have recognized the potential for MEMS (micro eclectro mechanical systems) actuators in flow control applications for large scale systems and have exploited these devices in a variety of configurations. One of a number of examples of work in this area is that of Ho and his co-investigators (e.g., Liu, Tsao, Tai, and Ho, 1994) who have used MEMS versions of 'flaps' to effect flow control. These investigators have opted to modify the distribution of streamwise vorticity on a delta wing and thus the aerodynamic rolling moment about the longitudinal axis of the aircraft.

Background Technology for Synthetic Jets

It was discovered at least as early as 1950 that if one uses a chamber bounded on one end by an acoustic wave generating device and bounded on the other end by a rigid wall with a small orifice, that when acoustic waves are emitted at high enough frequency and amplitude from the generator, a jet of air that emanates from the orifice outward from the chamber can be produced. See, for example, Ingard and Labate, *Acoustic Circulation Effects and the Nonlinear Impedance of Orifices, The Journal of the Acoustical Society of America*, March, 1950. The jet is comprised of a train of vortical air puffs that are formed at the orifice at the generator's frequency.

The concern of scientists at that time was only with the relationship between the acoustic impedance of the orifice and the "circulation" (i.e., the vortical puffs, or vortex rings) created at the orifice. There was no suggestion to combine or operate the apparatus with another fluid stream in order to modify the flow of that stream (e.g., its direction). Furthermore, there was no suggestion that following the ejection of each vortical puff, a momentary air stream of "make up" air of equal mass is drawn back into the chamber and that, as a result, the jet is effectively synthesized from the air outside of the chamber and the net mass flux out of the chamber is zero. There was also no suggestion that such an apparatus could be used in such a way as to create a fluid flow within a bounded (or sealed) volume.

Such uses and combinations were not only not suggested at that time, but also have not been suggested by any of the ensuing work in the art. So, even though a crude synthetic jet was known to exist, applications to common problems associated with other fluid flows or with lack of fluid flow in bounded volumes were not even imagined, much less suggested. Evidence of this is the persistence of certain problems in various fields which have yet to be solved effectively.

Vectoring of a Fluid Flow

Until now, the direction of a fluid jet has chiefly been controlled by mechanical apparatus which protrude into a jet flow and deflect it in a desired direction. For example, aircraft engines often use mechanical protrusions disposed in jet exhaust in order to vector the fluid flow out of the exhaust nozzle. These mechanical protrusions used to vector flow usually require complex and powerful actuators to move them. Such machinery often exceeds space constraints and often has a prohibitively high weight. Furthermore, in cases like that of jet exhaust, the mechanism protruding into the flow must withstand very high temperatures. In addition, large power inputs are generally required in order to intrude into the flow and change its direction. For all these reasons, it would be more desirable to vector the flow with little or no direct intrusion into the flow. As a result, several less intrusive means have been developed.

Jet vectoring can be achieved without active actuation using coanda effect, or the attachment of a jet to a curved (solid) surface which is an extension one of the nozzle walls (Newman, B. G. "The Deflexion of Plane Jets by Adjacent Boundaries-Coanda Effect," *Boundary Layer and Flow Control* v. 1, 1961 edited by Lachmann, G. V. pp. 232–265.). However, for a given jet momentum, the effect is apparently limited by the characteristic radius of the curved surface. The effectiveness of a coanda surface can be enhanced using a counter current flow between an external coanda surface and a primary jet. Such a system has been used to effect thrust vectoring in low-speed and high-speed jets by Strykowski et al. (Strykowski, P. J, Krothapalli, A., and Forliti D. J. "Counterflow Thrust Vectoring of Supersonic Jets," AIAA Paper No. 96-0115, AIAA 34th Aerospace Sciences Meeting, Reno, Nev., 1996.).

The performance of coanda-like surfaces for deflection of jets can be further improved by exploiting inherent instabilities at the edges of the jet flow when it is separated from the surface. It has been known for a number of years that substantial modification of shear flows can result from the introduction of small perturbations at the boundaries of the shear flow. This modification occurs because the shear flow is typically hydrodynamically unstable to these perturbations. Such instability is what leads to the perturbations' rapid amplification and resultant relatively large effect on the flow. This approach has been used in attempts to control separating flows near solid surfaces. the flow typically separates in the form of a free shear layer and it has been shown that the application of relatively small disturbances near the point of separation can lead to enhanced entrainment of ambient fluid into the layer. Because a solid surface substantially restricts entrainment of ambient fluid, the separated flow moves closer to the surface and ultimately can reattach to the surface. This effect has been used as a means of vectoring jets near solid surfaces. See e.g., Koch (Koch, C. R. "Closed Loop Control of a Round Jet/Diffuser in Transitory Stall," PhD. Thesis, Stanford University, 1990) (using wall jets along in a circular diffuser to effect partial attachment and thus vectoring of a primary round jet).

Similar to mechanical deflectors, technologies that rely on coanda surfaces are limited because of the size and weight of the additional hardware. Clearly, a coanda collar in aerospace applications must be carried along at all times whether or not it is being used.

As noted in the first part of this section (page 3), Fluidic technology based on jet-jet interaction has also been used for flow vectoring or producing oscillations of free jets. Fluidic actuators employing control jets to affect a primary jet of the same fluid within an enclosure that allows for inflow and outflow have been studied since the late 1950's. These actuators perform a variety of "analog" (e.g., proportional fluidic amplifier) and "digital" (e.g., flip-flop) throttling and control functions in flow systems without moving mechanical parts (Joyce, 1983). In the "analog" actuator, the volume flow rate fraction of two opposite control jets leads to a proportional change in the volume flow rate of the primary stream out of two corresponding output ports. The "digital" actuator is a bistable flow device in which the control jets and Coanda effect are used to direct the primary stream into one of two output ports.

These approaches have also been employed in free jets. Viets (1975) induced spontaneous oscillations in a free rectangular jet by exploiting the concept of a "flip-flop" actuator. More recently, Raman and Cornelius (1995) used two such jets to impose time harmonic oscillations in a larger jet by direct impingement. The control jets were placed on opposite sides of the primary jet and could be operated in phase or out of phase with each other.

Use of a fluidic jet to vector another flow, while known for years, has been used with limited success. In particular, the only way known to vector a jet with another jet (dubbed a "control jet") of the same fluid was to align the control jet so that it impinges directly on the primary jet. Obviously, this involved injection of mass into the flow and has not been deemed very effective at vectoring the primary flow because it relies on direct momentum transfer between the jets for altering the direction of the primary jet. Direct momentum transfer is not economical in general and undesirable when the available power is limited (such as on board an aircraft). Furthermore, such control hardware is difficult and expensive to install because of the complex plumbing necessary to supply the control jet with fluid to operate.

Modification of Fluid Flows About Aerodynamic Surfaces

The capability to alter the aerodynamic performance of a given airframe by altering its shape (e.g., the "camber" of an airfoil) during various phases of the flight can lead to significant extension of the airframe's operating envelope. Geometric modification of lifting surfaces has so far been accomplished by using mechanical flaps and slats. However, because of the complex control system required, such devices are expensive to manufacture, install and maintain. Furthermore, flap systems not only increase the weight of the airframe, but also require considerable interior storage space that could be used for cargo, and additional ancillary hardware (e.g., hydraulic pumps, piping, etc.). In some applications, the weight penalty imposed by the flaps may more than offset their usefulness.

In addition to the use of mechanical flaps, there has been considerable effort to enhance the aerodynamic performance of lifting surfaces by delaying flow separation and thus the loss of lift and increase in drag. Conventional methods for such flow control have primarily focused on delay of separation or inducement of reattachment by introducing small disturbances into the upstream wall boundary layer. Excitation methods have included external and internal acoustic excitation (Huang, Maestrello & Bryant, *Expt. Fl.* 15 1987), vibrating flaps (e.g., Neuberger & Wygnanski, *USAF A TR*-88 1987) and unsteady bleeding or blowing (e.g., Sigurdson & Roshko, *AIAA* 1985, and Seifert, Bachar, Koss, Shepshelovich & Wygnanski, *AIAA J.* 31 1993). These methods have been used with varying degrees of success. The effectiveness largely depends on the receptivity of the boundary layer to excitation within a relatively narrow bandwidth.

Other efforts of designers to modify the flow about an aerodynamic surface have centered on injection of energy into the boundary layer of the flow in order to augment lift, reduce drag, delay turbulent onset, and/or delay flow separation. For example, the method disclosed by U.S. Pat. No. 4,802,642 to Mangiarotty involves the retardation of a flow's transition to turbulence. However, this prior art does not and cannot change the effective aerodynamic shape of the airfoil. That is, the apparatus cannot change the direction of flow of the free stream fluid about the surface. Instead, the apparatus propagates acoustic excitation above the Tollmien-Schlichting frequency in an attempt to disrupt Tollmien-Schlichting waves as they begin to form and thereby delay the onset of turbulence. Although this method changes the drag characteristic of a lifting surface, the mean velocity field outside of the boundary layer and thus apparent aerodynamic shape of the surface remain unchanged.

Such devices as slots and fluid jets have also been extensively employed to inject energy into the boundary layer in order to prevent flow separation. Recently, efforts have turned to the use of piezoelectric or other actuators to energize the boundary layer along an aerodynamic surface. See, e.g., U.S. Pat. No. 4,363,991 to Edleman. These techniques, which employ acoustic excitation, affect the surface aerodynamic performance by suppressing or delaying the naturally occurring boundary layer separation. This method requires the flow state to be vulnerable to specific disturbance frequencies. Although effective at delaying flow separation, none of these devices alter significantly the apparent aerodynamic shape or mean velocity field of a given aerodynamic surface. Even though the changes in lift and drag that are caused by separation can be somewhat restored, there is no effect before separation occurs and the locus of the stagnation points remain largely unchanged. Therefore, before the present invention, no effective methods were suggested for altering the effective shape of an aerodynamic surface without the complexity, high expense, and weight penalty of mechanical flaps or slats.

Mixing of fluids at the small scale level

In a somewhat different field of study, the ability to effectively control the evolution of the shear layer between two streams of similar fluids (gas or liquid) may have great impact on the mixing between the two streams (e.g., mixing a hot exhaust plume with cold ambient air). The boundary between the two streams forms the turbulent flow region known as a "shear layer." Hydrodynamic instabilities in this shear layer induce a hierarchy of vortical structures. Mixing between the two streams begins with the entrainment of irrotational fluid from each stream by the large-scale vortical structures. These vortical structures scale with geometric features of the flow boundary (e.g., nozzle diameter of a jet, vortex generators, etc.) and they are critical to the mixing process between the two streams by bringing together in close contact volumes of fluid from each stream in a process that is referred to as entrainment. Layers of entrained fluid are continuously stretched and folded at decreasing scales by vortical structures that evolve through the action of shear and localized instabilities induced by larger vortical structures. This process continues until the smallest vortical scales are attained and fluid viscosity balances the inertial forces. This smallest vortical scale is referred to as the Kolmogorov scale. Thus, a long-held notion in turbulence is that the smallest and largest turbulent motions are indirectly coupled through a cascade of energy from the largest to successively smaller scales until the Kolmogorov scale is reached and the process is dominated by viscous diffusion. Turbulent dissipation is the process by which (near the Kolmogorov scale) turbulent kinetic energy is converted into heat as small fluid particles are deformed.

Scalar mixing (of heat or species, for example) is similar, but not identical to momentum mixing. Analogous to the Kolmogorov scale, the Batchelor scale is the smallest spatial scale at which an isoscalar particle can exist before scalar gradients are smoothed by the action of molecular diffusion. If scalar diffusion occurs on a faster scale than momentum diffusion, the Kolmogorov energy cascade breaks "packets" of scalars down into scales small enough that molecular scalar diffusion can occur (at the Batchelor scale). In this case, the Batchelor scale is larger than the Kolmogorov scale and turbulent motions persist at scales where scalar gradients have been smoothed out by diffusion. If, on the other hand, scalar diffusion occurs on a slower scale than momentum diffusion, turbulent motions stop (at the Kolmogorov scale) before the scalar gradients are smoothed out. Final mixing only occurs after laminar straining further reduces the size of the scalar layers.

There is a substantial body of literature that demonstrates that mixing in shear flows can be influenced by manipulating the evolution of the large scale eddies (vortical structures) within the flow. Because the large-scale eddies result from inherent hydrodynamic instabilities of the flow, they can be manipulated using either passive or active devices.

As noted above, although the entrainment process in turbulent shear flows is effected by the large-scale eddies, molecular mixing ultimately takes place at the smallest scales which are reached through a hierarchy of eddies of decreasing scales that continuously evolve from the largest scale eddies. Because the base flows are normally unstable at the large scales (and thus receptive to either passive or active control inputs), the traditional approach to controlling mixing at the small-scale has been indirect. Previous attempts to control small-scale mixing employing both passive and active control strategies have relied on manipulation of global two-and three-dimensional instability modes of the base flow with the objective of controlling mixing through the modification of the ensuing vortical structures.

Passive control has primarily relied on (permanent) modification of the geometry of the flow boundary. For example, mixing of jet exhaust is often enhanced by corrugating the exhaust port of a jet (e.g. Peterson, R. W. 1986 Turbofan Mixer Nozzle Flow Field—a Benchmark Experimental Study Journal of Engineering for Gas Turbines and Power 106, 692–698). This corrugation creates the appearance of a number of lobes defined by raised and recessed curves which induce counter-rotating vortices, thus promoting mixing in the direction of the exhaust flow. Other passive devices for the promotion of mixing have included small tabs that act as vortex generators. The disadvantage of such mixing devices is that their geometry is fixed and thus their effectiveness cannot be adjusted for varying flow conditions.

Conventional active control strategies overcome this deficiency because the control input can be adjusted. For example, the US patent of Wygnanski and Fiedler U.S. Pat. No. 4,257,224, describes the manipulation of large scale eddies in a plane shear layer between two uniform streams using a small oscillating flap. However, because this approach depends on the classical cascading mechanism to transfer control influence to the scales at which molecular mixing occurs, mixing at the smallest scales in fully turbulent flows is only weakly coupled to the control input. More importantly, mixing control of this nature relies on a priori knowledge of the flow instabilities and associated eigenfrequencies of the particular flow. Specifically, this method also requires that the flow be unstable to a range of disturbances, a condition which is not always satisfied Clearly, more efficient control of mixing in fully turbulent shear flows might be achieved by direct (rather than hierarchical) control of both the large-scale entrainment and the small-scale mixing processes. Such a control method has, before now, not been available but is enabled by piezoelectric actuators as described in prior patents and by synthetic jet actuators that are the subject of the present disclosure.

That synthetic jets operate without net mass injection enabler their using some common applications of mixing in a bounded volumes are, for example, mixing in chemical lasers, mixing for chemical or pharmaceutical products bioreactors etc. In addition to these fields, the development of methods for enhancement of mixing through manipulation of the flow in which it occurs will have a direct impact on the performance of various other technologically important systems (e.g., in bioengineering).

Cooling of Heated Bodies

Cooling of heat-producing bodies is a concern in many different technologies. Particularly, a major challenge in the design and packaging of state-of-the-art integrated circuits in single- and multi-chip modules (MCMs) is the ever increasing demand for high power density heat dissipation. While current technologies that rely on global forced air cooling dissipate about 4–6 W/cm$^2$, the projected industrial cooling requirements are 10 to 40 W/cm$^2$ and higher within the next five to ten years. Furthermore, current cooling technologies for applications involving high heat flux densities are often complicated, bulky and costly.

Traditionally, this need has been met by using forced convective cooling using fans which provide global overall cooling when what is often required in pinpoint cooling of a particular component or set of components. Furthermore, magnetic-motor-based fans generate electromagnetic interference which can introduce noise into the system.

In applications when there is a heat-producing body in a bounded volume, the problem of cooling the body is substantial. In fact, effective cooling of heated bodies in closed volumes has also been a long standing problem for many designers. Generally, cooling by natural convection is the only method available since forced convection would require some net mass injection (e.g., air) into the system, and subsequent collection of this mass. The only means of assistance would be some mechanical fan wholly internal to the volume. However, often this requires large moving parts in order to have any success in cooling the heated body. These large moving parts naturally require high power inputs. But, simply allowing natural convective cooling to carry heat from the body producing it into the fluid of the volume and then depending on the housing walls to absorb the heat and emit it outside the volume is limited to low-power applications.

SUMMARY OF THE INVENTION

Briefly described, the present invention involves improvements to synthetic jet actuators and various advances in the construction and novel application of such synthetic jet actuators.

A first object of the present invention is to provide an improved device for asserting indirect, non-intrusive control over a fluid flow. Most of the previous approaches to flow control can be classified as direct contact actuators. That is, actuators that have mechanically moving parts that come into direct contact with the flow in order to effect control authority. In contrast to these approaches, the fluidic technology based on synthetic jet actuators, which is the subject of the present invention, allows indirect assertion of control authority by fludic momentum transfer across the flow boundary.

Another object of the present invention is for producing a synthetic jet of fluid synthesized from the working fluid of the medium where the synthetic jet actuator is deployed. Thus, linear momentum is transferred to the flow system without net mass injection into the system.

Another object of the present invention is for a synthetic jet actuator producing a jet stream for actively controlling fluid flows while eliminating the need for any complex piping or plumbing.

Another object of the present invention is to provide a jet actuator which responds very quickly and is able to operate effectively at high frequencies.

Another object of the present invention is to provide an alternate method of forming a synthetic jet actuator, which is better suited for use in a solid object having an arbitrary shape (i.e. planar or curved).

Another object of the present invention is for an alternate synthetic jet actuator which can vector its own synthetic jet fluid by non-intrusive modification of an actuator orifice or by controlled interaction with a cluster of similar adjacent actuators.

A. First Preferred Embodiment

A first preferred embodiment of a system for modifying a direction of a fluid flow comprises, initially, an improved synthetic jet actuator. Generally, synthetic jet actuators are described in the patent of Glezer, et al., U.S. Pat. No. 5,758,823, of which this is a continuation. The improved synthetic jet actuator of the first preferred embodiment comprises a housing defining an internal chamber. An orifice, or opening, is defined by a wall of the housing. The jet further includes a mechanism in or about the housing for periodically changing the volume within said internal chamber so that a series of fluid vortices are generated and projected in an external environment out from the orifice of the housing. The volume changing mechanism can be any suitable mechanism, for instance, a piston positioned in the jet housing to move so that fluid is moved in and out of the orifice during reciprocation of the piston. Preferably, the volume changing mechanism is implemented by using a flexible diaphragm as a wall of the housing. The flexible diaphragm is preferably actuated by an electrical bias or a piezoelectric element.

Typically, a control system is utilized to create time-harmonic motion of the diaphragm. As the diaphragm moves into the chamber, decreasing the chamber volume, fluid is ejected from the chamber through the orifice. As the fluid passes through the orifice, the flow separates at the sharp edges of the orifice and creates vortex sheets which roll up into vortices. These vortices move away from the edges of the orifice under their own self-induced velocity.

As the diaphragm moves outward with respect to the chamber, increasing the chamber volume, ambient fluid is drawn from the orifice into the chamber. Since the vortices are already removed from the edges of the orifice, they are not affected by the ambient fluid being entrained into the chamber. As the vortices travel away from the orifice, they synthesize a jet of fluid, a "synthetic jet," through entrainment of the ambient fluid.

The operation of synthetic jets in various applications is described fully in the prior-filed patent application, of which this is a continuation-in-part. One specific improvement to the synthetic jet actuator of the first embodiment, which is a focus of this disclosure, will now be described. Particularly, the entrainment of ambient fluid that is induced by a synthetic jet actuator near the orifice can be exploited for dynamic vectoring of the synthetic jet actuator fluid. This is accomplished by alteration of the synthetic jet actuator orifice shape near an exit plane of the jet. Such orifice alteration yields a Coanda effect, that is, the attachment of circular and non circular jets to solid surfaces which prevent entrainment of ambient fluid along the path of the jet. Such a Coanda effect, and consequently self-vectoring, can be achieved either by deformation of the orifice directly or by deployment of a small flap near the jet orifice.

The small flap is normally flat against the outer wall of the synthetic jet actuator. If a flap is deployed along the wall just above the orifice of a synthetic jet actuator, the synthetic jet flow will be vectored upward, toward the flap. Similarly, if the upper side of the synthetic jet orifice is moved outward from the jet chamber interior, the flow will also vector upward.

1. Vectoring Another Fluid Flow

As noted above, the synthetic jet actuator of the first preferred embodiment produces a synthetic jet stream of fluid. This stream can be directed to contact a primary jet stream in order to control, or vector, the primary jet stream. The primary jet can be either a conventional jet stream or another synthetic jet stream. Of course, the particular effect of a synthetic control jet on a primary jet is a function of how the system is designed. This interaction was described in detail in the application of which this disclosure is a Continuation-in-part.

In the most simple system, a synthetic control jet is attached to the top housing of a primary jet such that the direction of its flow will be parallel to the direction of the primary jet flow. If the two jets are allowed to operate at the same time, the synthetic jet actuator will have the effect of vectoring the primary jet. If the synthetic control jet orifice is near or slightly downstream of the exhaust plane of the primary jet, then the primary jet flow will be vectored toward the synthetic control jet. On the other hand, if the synthetic control jet orifice is placed at some distance behind the exhaust plane of the primary jet, then the primary jet will be vectored away from the control jet due to the synthetic jet flow negotiating the ninety-degree turn at the end of the primary jet housing and directly impinging into the flow of the primary jet.

The characteristic of the first embodiment for a synthetic jet actuator to self-vector, can be used to enhance the vectoring effect that a synthetic control jet will have on a primary jet. When a synthetic jet actuator is placed on the upper housing surface of a primary jet with both orifices in the same or slightly downstream of the exhaust plane, the primary jet flow will be "pulled" upward, as described above. It appears that when the synthetic jet actuator is self-vectored by deployment of a flap above its orifice or moving the upper wall forming the orifice outward, or by using a cluster of adjacent jets, more of the fluid supplied to the synthetic jet will come from below its orifice than from above. Thus, it will draw the primary jet toward it with more force, and the amount of directional change in the primary jet will be enhanced.

2. Synthetic Jet Actuator Pairs

A further application of synthetic jet actuators vectoring other fluid flows involves deploying separately controllable synthetic jet actuators in a pair, or an array of actuators. Unlike conventional fluid jets, when synthetic fluid jets are aligned parallel to one another, with exit orifices in the same plane and very near one another, the fluid flows emanating from the orifices will cascade their strength. In fact, the two flows will merge to form a single, stronger fluid flow. When two or more synthetic jets are arranged in this manner, the total momentum of the resulting fluid flow is the sum of the two jets operated independently.

A preferred embodiment of such an arrangement comprises a single housing with an orifice in one wall of the housing. Two housing walls adjacent to the wall with the orifice, and opposite one another, are constructed as flexible membranes. These membranes house excitation devices, such as piezoelectric actuators, which are separately wired to a control device, such as a time-harmonic wave generator. Spanning from the housing wall with the orifice to an opposite housing wall is a rigid partition. This rigid partition is securely attached to four of the housing walls such that it forms a plane parallel to the planes of the two flexible membranes. The partition is constructed so that the orifice is bisected by this rigid partition. Thus, the housing is divided into two separate chambers of approximately equal volume.

Under normal operation, the two flexible membranes are stimulated by the excitation devices, piezoelectric elements, such that they oscillate in time-harmonic motion. This time-harmonic motion of the diaphragms will cause a single fluid jet to be synthesized at the mouth of the orifice and move away from the orifice. Because there are two synthetic jets in this preferred embodiment, two jets will be formed. However, the exit points of the two chambers are so close, that the two jets rapidly merge into a single fluid flow moving away from the orifice. The two synthetic jets are said to merge.

While cascading synthetic jets in order to increase their strength is a unique feature of the present invention, a further application of the present embodiment becomes possible when the two flexible membranes are oscillated out of phase with one another. When this modification is made, the direction of the fluid flow will change without physically changing the attitude of the housing. The particular direction of the fluid coming from the orifice depends on just how out of phase the two oscillatory members are. Thus, just as with the modification of a synthetic jet actuator orifice, synthetic jets can be vectored non-intrusively.

B. Second Preferred Embodiment: Jet Having Louvers

In addition to the basic design of a synthetic jet actuator, one may modify the design to enhance performance of the jet. Another preferred embodiment of a synthetic jet actuator relates to a synthetic jet actuator that has a housing defining an interior chamber and an orifice in one wall of the housing. The synthetic jet actuator has a device or mechanism for withdrawing fluid into the chamber and for forcing fluid out of the chamber through the orifice. At least one louver is attached to the housing and is aligned with an opening formed in the housing. The louver is a one-way valve and only permits fluid flow in one direction. Thus, the louver permits fluid flow either into the chamber through the opening or out of the chamber through the opening.

The operation of the synthetic jet actuator can vary greatly depending upon whether the louver permits fluid to flow into the chamber or instead only permits fluid to flow out of the chamber. If the louver permits fluid flow into the chamber, then the synthetic jet actuator is able to withdraw fluid into the chamber through a greater surface area. The force of the jet formed by the synthetic jet actuator, however, is not decreased since all of the fluid exits the chamber through the orifice. The synthetic jet actuator with this configuration can operate at higher momentum during the out stroke. Alternatively, if the louver only permits fluid to flow out of the chamber, then the synthetic jet actuator will operate at higher momentum during the in stroke.

The louvered synthetic jet actuator can also be designed as a mixer or as a pump. As a mixer, fluid from one source can be introduced through the opening and can be mixed with fluid introduced into the chamber through the orifice. The synthetic jet actuator may have more than one louver so that a plurality of different fluids may be introduced and mixed in the chamber. As a pump, the synthetic jet actuator has a louver positioned over the orifice as well as over the opening. The synthetic jet actuator operates by introducing fluid into the chamber through the opening and not through the orifice and then discharges fluid from the chamber through the orifice and not the opening.

The synthetic jet actuator may have any suitable louver and any suitable mechanism or device for withdrawing fluid into the chamber and for forcing fluid out of the chamber. For instance, the louver may be a passive louver or an active louver, such as one whose position is at least partially controlled by a piezo-electric material. The device or mechanism may comprise a piston reciprocating within the chamber or may comprise a flexible diaphragm driven by piezo-electric actuation, or other suitable electrostatic or electromagnetic devices.

C. Third Preferred Embodiment: Constant Suction Synthetic Jet Actuator

The synthetic jet actuators described in the first and second preferred embodiments are not the only methods of and devices for forming a synthetic jet. Indeed, there are several ways to build such a jet actuator and still use the basic principles disclosed herein. For example, in certain applications a constant suction synthetic jet actuator may be desirable. In this preferred embodiment, a synthetic jet actuator typically will be embedded in a body and operate through its outer surface. Further, there may be no room in the body for a piston or other volume changing means suggested by the previous preferred embodiments. This embodiment provides a solution to such a potential problem.

One possible configuration which illustrates this concept is to have two concentric pipes in the body normal to the outside surface. The outer pipe is preferably connected to a source of fluid with a means for pulsing fluid out of this pipe. The innermost pipe of the concentric pipe arrangement is connected to an appropriate device for pulling fluid down this pipe from the ambient fluid above the planar surface, such as a pump or vacuum. Situated such that its exit plane is slightly below the surface, in operation, the innermost pipe constantly pulls fluid down its length from the ambient fluid above the flat, planar surface while the outer pipe is caused to pulse fluid into the ambient environment above the planar surface. Such an operation will cause a synthetic fluid jet to form above the constant suction synthetic jet actuator. This embodiment of a synthetic jet actuator can be used in precisely the same ways as the first preferred embodiment of a synthetic jet actuator. Another possibility is to produce a cluster of orifice with designated suction or blowing functions. This third preferred embodiment satisfies the same objectives and exhibits the same advantages of the first preferred synthetic jet actuator embodiment.

Therefore, an advantage to the present invention is that the synthetic jet actuators described above eliminate the need for complex piping or plumbing to carry fluid to the synthetic jet actuator for any application in which it is used.

Another advantage to the present invention is that the zero net mass flux synthetic jet actuator will be much easier to manufacture and be much more readily installed in places where space constraints are critical than other jet actuators.

Another advantage to the use of synthetic control jets for vectoring a fluid flow is that the two jets can be placed in parallel. This simplifies the installation and maintenance of the primary jet and the synthetic control jet.

An advantage to the augmented synthetic jet actuator described in the first preferred embodiment is that the location of the synthetic control jet orifice, alone, determines the direction of the self-vectoring. Thus, the direction of vectoring can be changed rapidly by a mere shift in the position of the synthetic jet actuator orifice. This feature allows a single synthetic jet actuator to vector a primary jet in any direction by moving the body of the synthetic jet actuator.

Another advantage to the use of a synthetic jet actuator to vector another primary jet is that synthetic jet actuators vector economically and the power input to the synthetic control jet can be quite small.

An additional advantage is that the controller bandwidth may be very high due to the fact that the primary flow responds at the frequency of the diaphragm of the synthetic jet actuator. This driving frequency can vary from several hundred hertz to several kilohertz and, furthermore, broad operating band can be attained at a given actuator frequency by using frequency or amplitude modulation.

An additional advantage to the preferred embodiments of the present invention becomes obvious when a synthetic jet actuator is used to control another synthetic jet actuator. In this way, the direction of the synthetic jet pair, or array, can be dynamically and accurately controlled by merely modifying the phase angle of the two volume changing means in the jet actuator pair. Complex and disruptive mechanical flow modifiers, which are necessary to modify the direction in the prior art, are not necessary to the present invention.

Other objects, features, and advantages of the present invention will be apparent to those skilled in the art. A more thorough understanding of the invention will be gained through a review of the detailed description set forth below, when taken in conjunction with the accompanying drawings, which are briefly described as follows.

BRIEF DESCRIPTION OF THE DRAWINGS

The present invention can be better understood with reference to the following drawings. The drawings are not necessarily to scale, emphasis instead being placed upon clearly illustrating principles of the present invention. Moreover, like reference numerals designate corresponding parts throughout the several views.

DETAILED DESCRIPTION OF THE PREFERRED EMBODIMENTS

It will be obvious to those skilled in the art that many modifications and variations may be made to the preferred embodiments of the present invention as described hereafter without substantially departing from the spirit and scope of the present invention. All such modifications and variations are intended to be included herein within the scope of the present invention, as is set forth in the appended claims.

I. First Preferred Embodiment

A. Construction of the Synthetic Jet Actuator

Figure 1A:
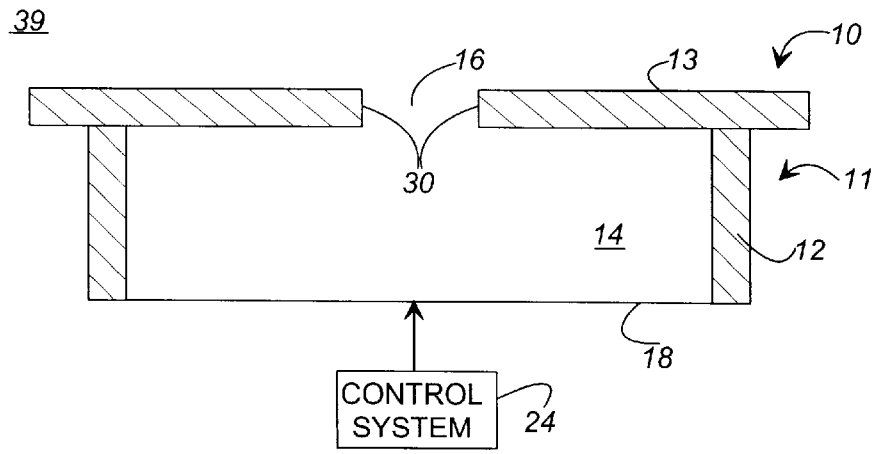
FIG. 1A is a schematic cross-sectional side view of a zero net mass flux synthetic jet actuator with a control system.

FIG. 1A depicts a synthetic jet actuator 10 comprising a housing 11 defining and enclosing an internal chamber 14. The housing 11 and chamber 14 can take virtually any geometric configuration, but for purposes of discussion and understanding, the housing 11 is shown in cross-section in FIG. 1A to have a rigid side wall 12, a rigid front wall 13, and a rear diaphragm 18 that is flexible to an extent to permit movement of the diaphragm 18 inwardly and outwardly relative to the chamber 14. The front wall 13 has an orifice 16 of any geometric shape. The orifice diametrically opposes the rear diaphragm 18 and connects the internal chamber 14 to an external environment having ambient fluid 39.

The flexible diaphragm 18 may be controlled to move by any suitable control system 24. For example, the diaphragm 18 may be equipped with a metal layer, and a metal electrode may be disposed adjacent to but spaced from the metal layer so that the diaphragm 18 can be moved via an electrical bias imposed between the electrode and the metal layer. Moreover, the generation of the electrical bias can be controlled by any suitable device, for example but not limited to, a computer, logic processor, or signal generator. The control system 24 can cause the diaphragm 18 to move periodically, or modulate in time-harmonic motion, and force fluid in and out of the orifice 16.

A more particular device for producing the time harmonic motion of the diaphragm 18 is a piezoelectric actuator. A common piezoelectric actuator may be attached by adhesive, or other means, to the flexible diaphragm 18. When the piezoelectric device is caused to vibrate by an electrical current, the diaphragm 18 will also vibrate at a corresponding frequency in time harmonic motion. A computer, or even a wave generator, would be an appropriate control and/or actuation device for a piezoelectric actuator.

Figure 1B:
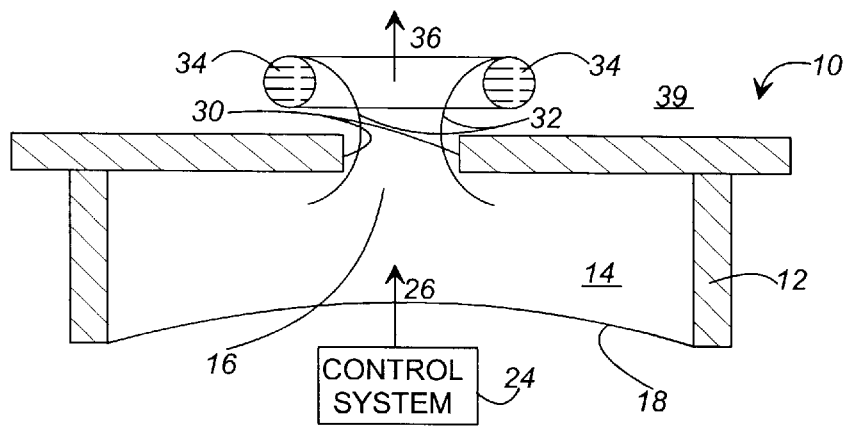
FIG. 1B is a schematic cross-sectional side view of the synthetic jet actuator of FIG. 1A depicting the jet as the control system causes the diaphragm to travel inward, toward the orifice.

The operation of the synthetic jet actuator 10 will now be described with reference to FIGS. 1B and 1C. FIG. 1B depicts the synthetic jet actuator 10 as the diaphragm 18 is controlled to move inward into the chamber 14, as depicted by arrow 26. The chamber 14 has its volume decreased and fluid is ejected through the orifice 16. As the fluid exits the chamber 14 through the orifice 16, the flow separates at sharp orifice edges 30 and creates vortex sheets 32 which roll into vortices 34 and begin to move away from the orifice edges 30 in the direction indicated by arrow 36.

Figure 1C:
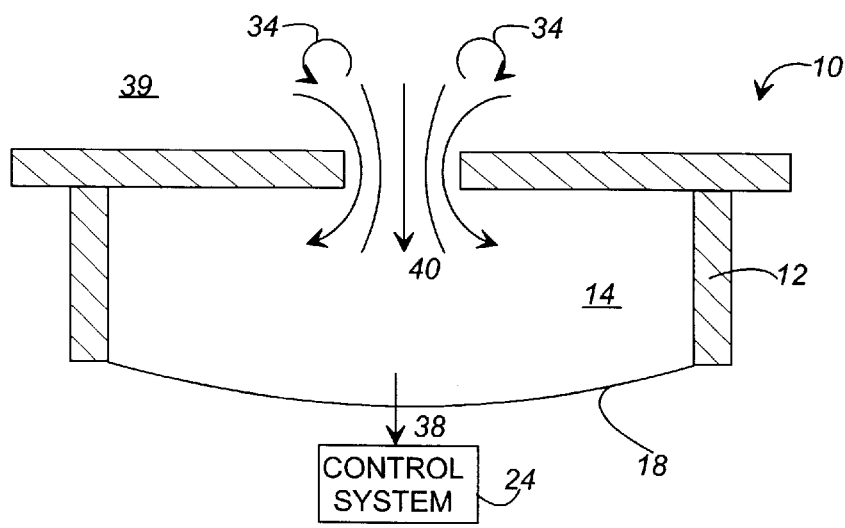
FIG. 1C is a schematic cross-sectional side view of the synthetic jet actuator of FIG. 1A depicting the jet as the control system causes the diaphragm to travel outward, away from the orifice.

FIG. 1C depicts the synthetic jet actuator 10 as the diaphragm 18 is controlled to move outward with respect to the chamber 14, as depicted by arrow 38. The chamber 14 has its volume increased and ambient fluid 39 rushes into the chamber 14 as depicted by the set of arrows 40. The diaphragm 18 is controlled by the control system 24 so that when the diaphragm 18 moves away from the chamber 14, the vortices 34 are already removed from the orifice edges 30 and thus are not affected by the ambient fluid 39 being drawn into the chamber 14. Meanwhile, a jet of ambient fluid 39 is synthesized by the vortices 34 creating strong entrainment of ambient fluid drawn from large distances away from the orifice 16.

B. Use Of A Synthetic Jet Actuator To Vector Fluid Flow From A Conventional Jet

Figure 2A:
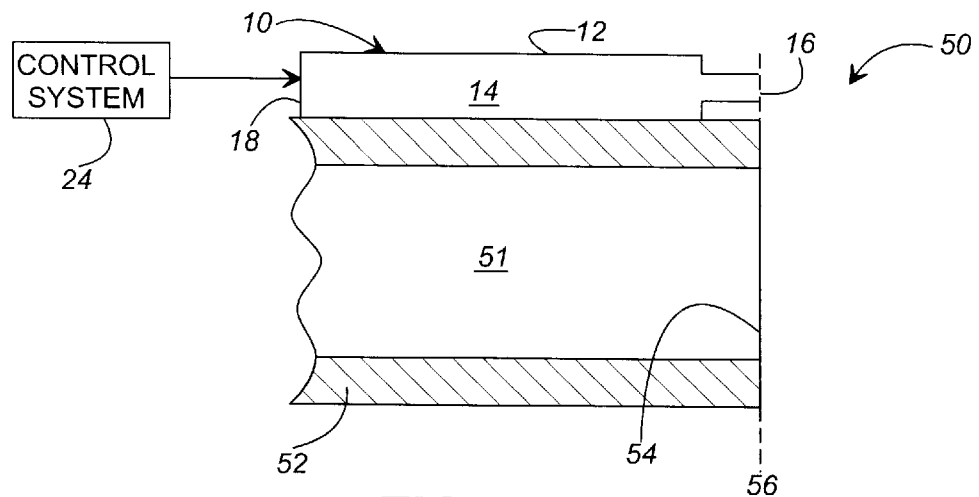
FIG. 2A is a schematic cross-sectional side view of a first embodiment of a system for vectoring a primary jet with the synthetic jet actuator of FIG. 1A.

The synthetic jet actuator 10 is particularly effective at controlling the direction of, or vectoring, the flow of fluid projected from another jet, whether the other jet is a synthetic jet or a conventional jet. FIG. 2A depicts one possible configuration of a jet vectoring system 50. The synthetic jet actuator 10 and a primary jet 51 are used in the jet vectoring system 50. As described above, the synthetic jet actuator 10 generally comprises a housing 11 defining a chamber 14. The chamber 14 is bounded on one end by a flexible diaphragm 18, and the housing 11 has an orifice 16 therein. The diaphragm 18 is caused to oscillate by a control system 24 so that a synthetic jet stream is propagated from the orifice 16.

The primary jet actuator 51 is comprised of a housing 52 and a means for expelling fluid out of the primary jet exit 54. A particular example of such a primary jet actuator 51 could be a jet engine or other fluid emitting device. The control synthetic jet actuator 10 is disposed on the top surface of the primary jet housing 52. The control synthetic jet actuator 10 is positioned such that the synthetic control jet orifice 16 and the primary jet exit 54 are in approximately the same plane (primary jet exhaust plane), as depicted by broken line 56.

Figure 2B:
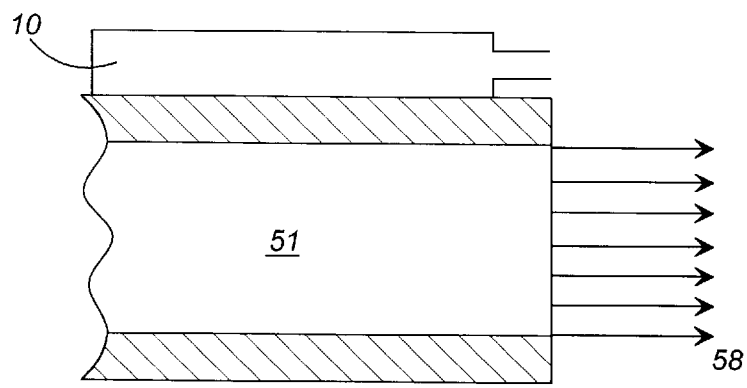
FIG. 2B is a schematic cross-sectional side view of the system of FIG. 2A with only the primary jet being operational.

In FIG. 2B, the primary jet actuator 51 is operating unforced, that is, with the control synthetic jet actuator 10 not operational. The fluid emitted by the primary jet actuator 51 is depicted by the set of arrows 58. The expulsion of fluid, as depicted by arrows 58, occurs generally normal to the exhaust plane 56 of the primary jet actuator 51.

Figure 2C:
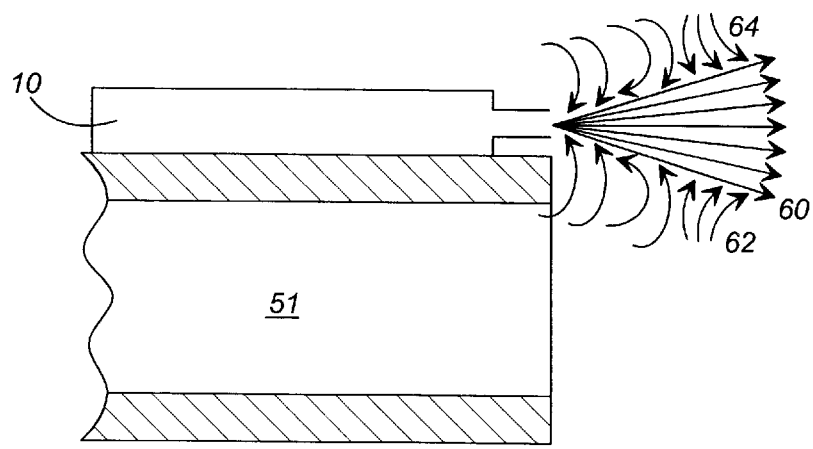
FIG. 2C is a schematic cross-sectional side view of the system of FIG. 2A with only the synthetic control jet being operational.

In FIG. 2C, the control synthetic jet actuator 10 is depicted operating with the primary jet 51 not operational. The set of arrows 60 represent the streamlines of fluid flowing from the control synthetic jet actuator 10. Two sets of arrows 62, 64, represent the ambient fluid being entrained into a synthetic jet stream 60 from the control synthetic jet actuator 10.

Figure 2D:
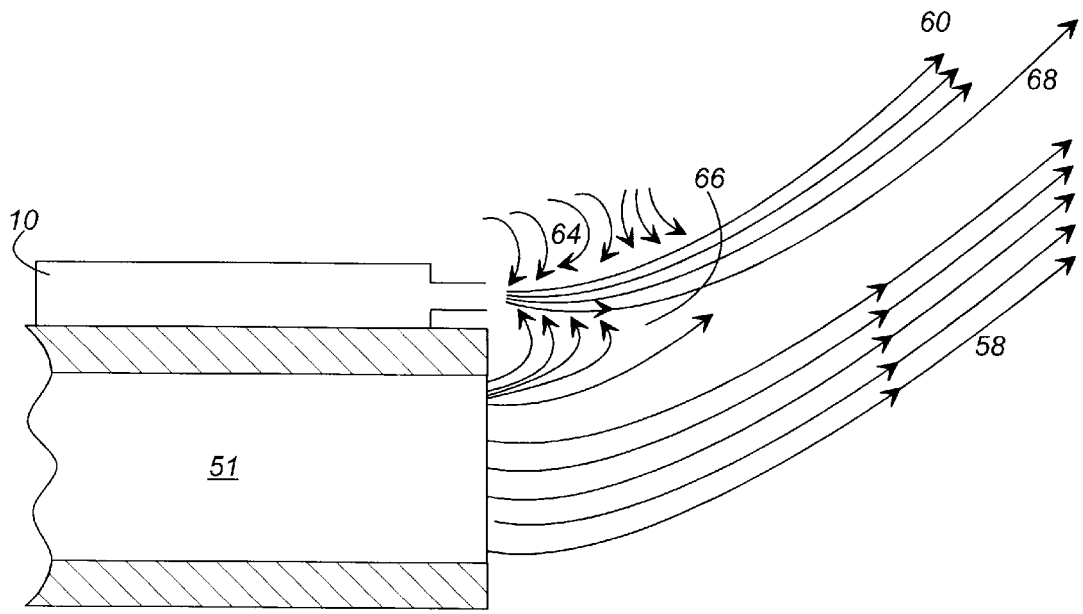
FIG. 2D is a schematic cross-sectional side view of the system of FIG. 2A with both the primary jet and the synthetic control jet being operational.

FIG. 2D shows the results when both the control synthetic jet actuator 10 and the primary jet actuator 51 are operational at the same time in the previously described system 50. When the synthetic control jet flow 60 is allowed to interact with the primary jet flow 58, the control synthetic jet actuator 10 draws some of the primary jet flow 58 into the synthetic control jet orifice 16, resulting in an intense low pressure region 66 between the synthetic control jet orifice 16 and the primary jet exit 54. Due to this low pressure region 66, the primary jet flow 58 is vectored upward, i.e., toward the control synthetic jet actuator 10.

To achieve the vectoring of the primary jet flow 58 upward, the synthetic control jet orifice 16 and the primary jet exit 54 should be disposed in approximately the same exhaust plane 56 or farther downstream. If the entire control synthetic jet actuator 10 is moved along the top housing 52 of the primary jet actuator 51 away from the primary jet exhaust plane 56, as depicted in FIG. 2E, then the effect of the control synthetic jet actuator 10 on the primary jet flow 58 changes dramatically.

Figure 2E:
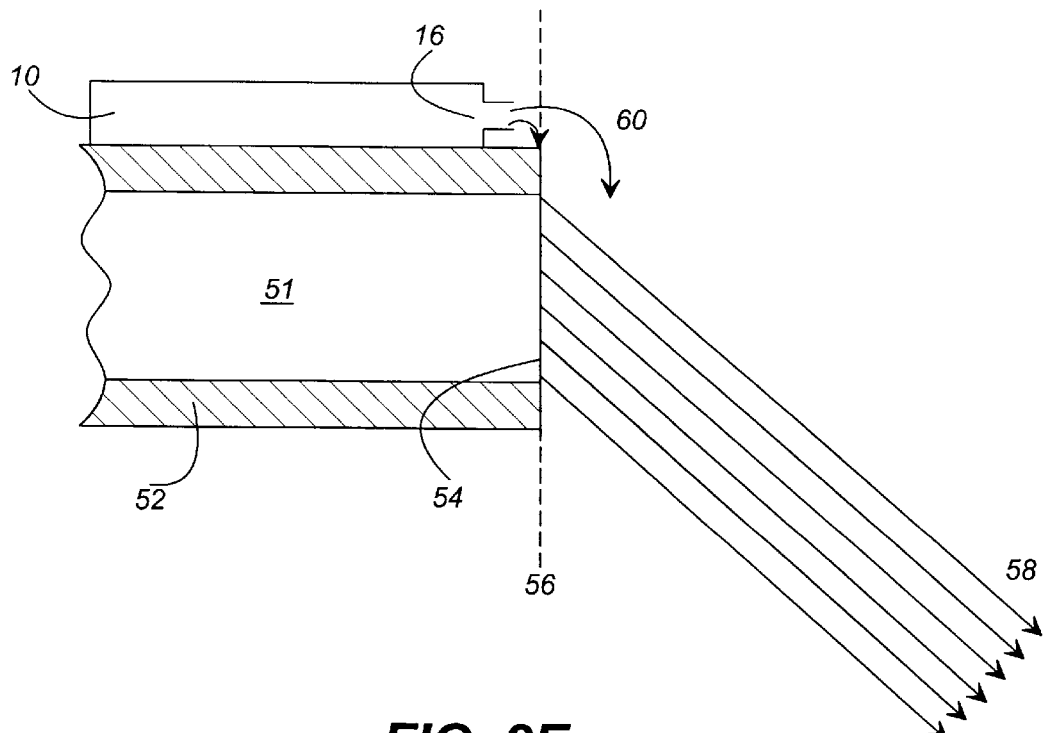
FIG. 2E is a schematic cross-sectional side view of a second embodiment of a system for vectoring a primary jet with the synthetic jet actuator of FIG. 1A.

The effect of the synthetic jet actuator 10 on the primary jet flow 58 when the control synthetic jet actuator is moved backward as described is depicted in FIG. 2E. Once the control synthetic jet actuator 10 is moved to greater than a certain distance behind the primary jet exhaust plane 56, the synthetic jet flow 60 will attach to the primary jet housing 52, upon which it is mounted, due to the Coanda effect. However, this attachment is stronger than ordinary Coanda effect, owing to fluid sucked out of a recirculation bubble, rather than relying on entrainment into the synthetic jet actuator 10 to cause a low pressure region to form near the synthetic jet orifice 16.

In the configuration depicted in FIG. 2E, when the synthetic jet orifice 16 is a certain distance behind the primary jet exit plane 56, the synthetic jet flow 60 will negotiate the 90-degree turn at the end of the primary jet housing 52. The synthetic jet flow 58 will then impinge on the primary jet flow 69 and cause the primary jet flow 58 to be vectored downward, away from the control synthetic jet actuator 10, as shown in FIG. 2E.

Therefore, a primary jet actuator 51 may be vectored either upward or downward by a control synthetic jet actuator 10 of far lesser strength by merely moving the control synthetic jet actuator 10 forward or backward along the primary jet housing 52. This gives an operator a means of quickly and easily changing the path of the primary jet flow 58, if desired.

B. Augmentation of Vectoring: Modification of the Exit Orifice

As a result of the strong entrainment of ambient fluid induced by the synthetic jet actuator 10, a jet can be made to dynamically vector itself. This is accomplished by alteration of an external surface surrounding the orifice near a jet exit plane to achieve a Coanda effect on the synthetic jet stream.

Figure 3A:
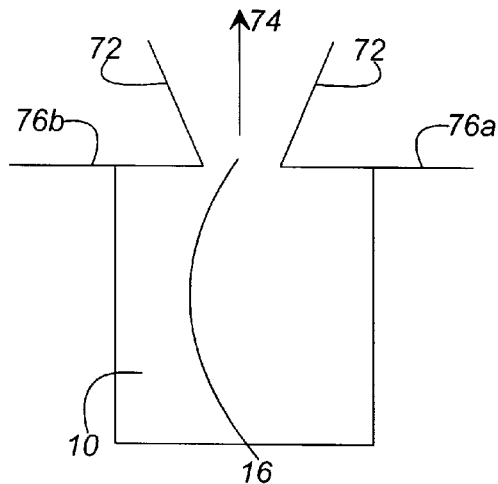
FIG. 3A is a schematic cross-sectional side view of the synthetic jet actuator of FIG. 1A in operation showing the direction of jet propulsion when the external surface surrounding the orifice is uniform.

FIG. 3A depicts the outer flow streamlines 72 of a synthetic jet actuator 10, while the synthetic jet actuator 10 is in operation. The external surface surrounding the orifice 16 is undistorted and hence the overall fluid flow, as depicted by arrow 74, out of the synthetic jet orifice 16 is substantially normal to the upper synthetic jet housing walls 76a, 76b and parallel to an axis symmetric about the midline of the orifice 16.

Figure 3B:
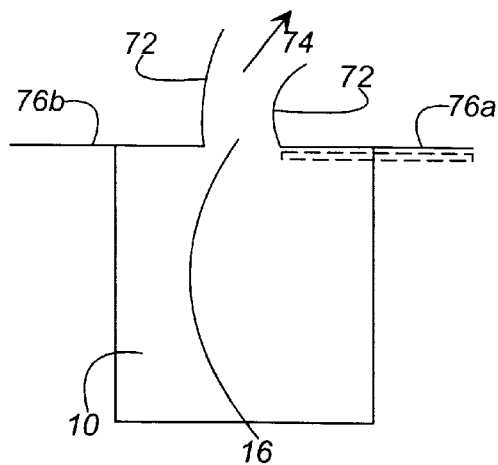
FIG. 3B is a schematic cross-sectional side view of the synthetic jet actuator of FIG. 1A in operation with a wall the borders the orifice raised slightly in order to deform the external surface surrounding the orifice.

FIG. 3B depicts a configuration where the synthetic jet actuator 10 has its housing wall 76a on the right side of the jet orifice 16 raised with respect to the wall 76b on the left side of the jet orifice 16. This configuration results in an irregular, or nonuniform, external surface about the orifice 16. Entrainment of fluid into the jet orifice 16 and into the fluid stream 74 is retarded on the right side of the jet. Therefore, the synthetic jet flow 74 is vectored to the right, i.e., toward the raised housing wall 76a, by this adjustment to the housing wall 76a of the synthetic jet actuator 10.

Figure 3C:
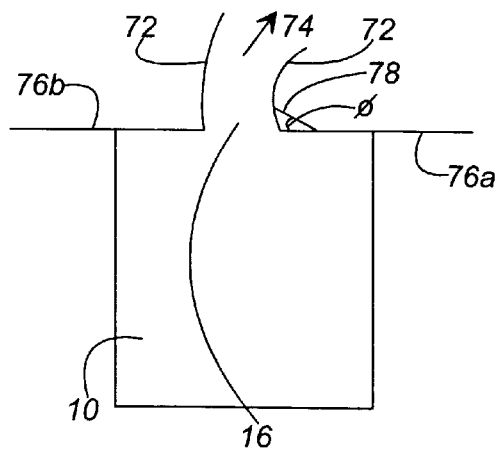
FIG. 3C is schematic cross-sectional side view of the synthetic jet actuator of FIG. 1A in operation with a small flap slightly raised in order to deform the external surface surrounding the orifice.

FIG. 3C depicts another method of distorting the flow of the synthetic stream from the orifice 16. A flap 78 that is normally flat against the jet housing wall 76a is raised to some angle f. The flap 78 retards entrainment of fluid only on one side of the orifice 16 just as raising the right wall 76a did. Therefore, the synthetic jet flow 74 is vectored toward the side of the orifice 16 where the flap 78 is deployed. The outermost streamlines 72 of the synthetic jet flow 74 are shown in FIG. 3C to demonstrate the extent of the vectoring caused by deploying the flap 78.

The ability of the synthetic jet to self-vector, as just demonstrated, can be used to enhance the vectoring effect that a synthetic jet actuator 10 will have on a fluid flow from a primary jet actuator.

Figure 4A:
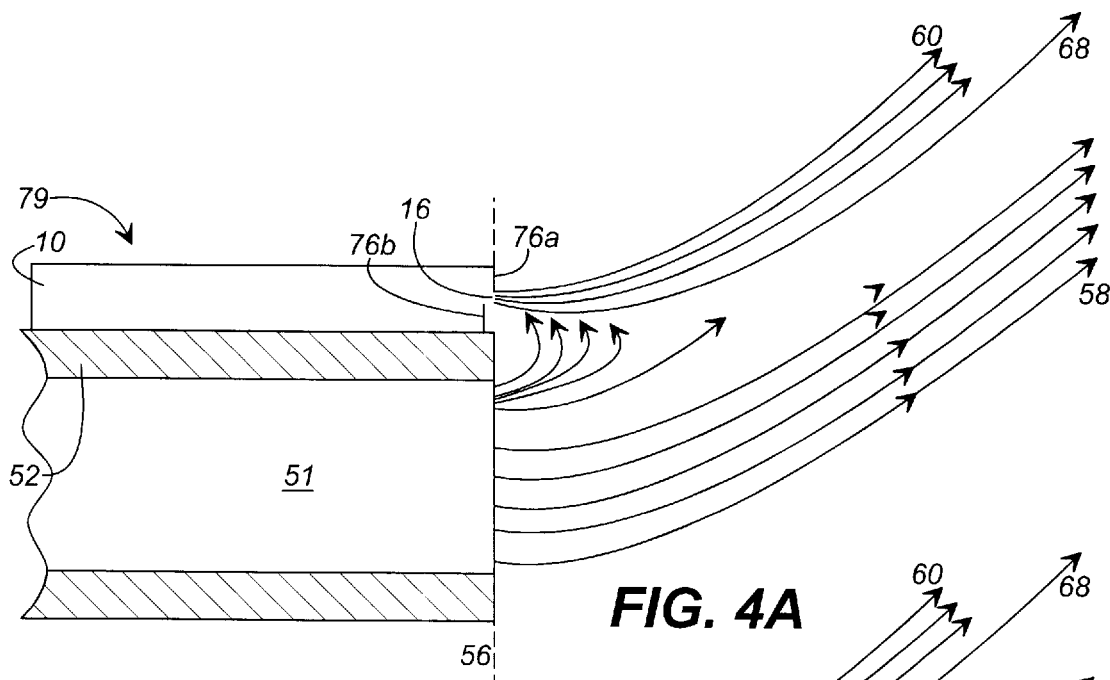
FIG. 4A is a schematic cross-sectional side view of an augmented synthetic jet vectoring system in operation, wherein the vectoring of the primary jet is augmented by deformation of the external surface surrounding the synthetic jet orifice.

FIG. 4A depicts a possible configuration of an augmented jet vectoring system 79. Only a control synthetic jet actuator 10 and a primary jet actuator 51 are used in the system 79. The control synthetic jet actuator 10 is generally comprised of the elements as described above. The primary jet actuator 51 is comprised of a housing 52 and a means of expelling fluid out of the primary jet exit 54. The control synthetic jet actuator 10 is disposed on the top side of the primary jet housing 52. The control synthetic jet actuator 10 is positioned such that the synthetic control jet orifice 16 and the primary jet exit 54 are in approximately the same exhaust plane 56. Note that the synthetic control jet orifice 16 is formed by upper wall 76a and lower wall 76b.

In the above described system 79, the external surface about the synthetic control jet orifice 16 can be modified by moving wall 76b toward the back of the control synthetic jet actuator 10, as shown in FIG. 4A. This deformation will cause the synthetic control jet flow 60, when acting alone, to self-vector away from the primary jet actuator 51. When the control synthetic jet actuator 10 and the primary jet actuator 51 are allowed to operate at the same time, the vectoring of the primary jet flow 58 caused by the synthetic control jet flow 60 will be enhanced and the primary jet flow 58 will be vectored at a greater angle upward than if the synthetic control jet orifice 16 were undeformed, as shown in FIG. 4A.

Figure 4B:
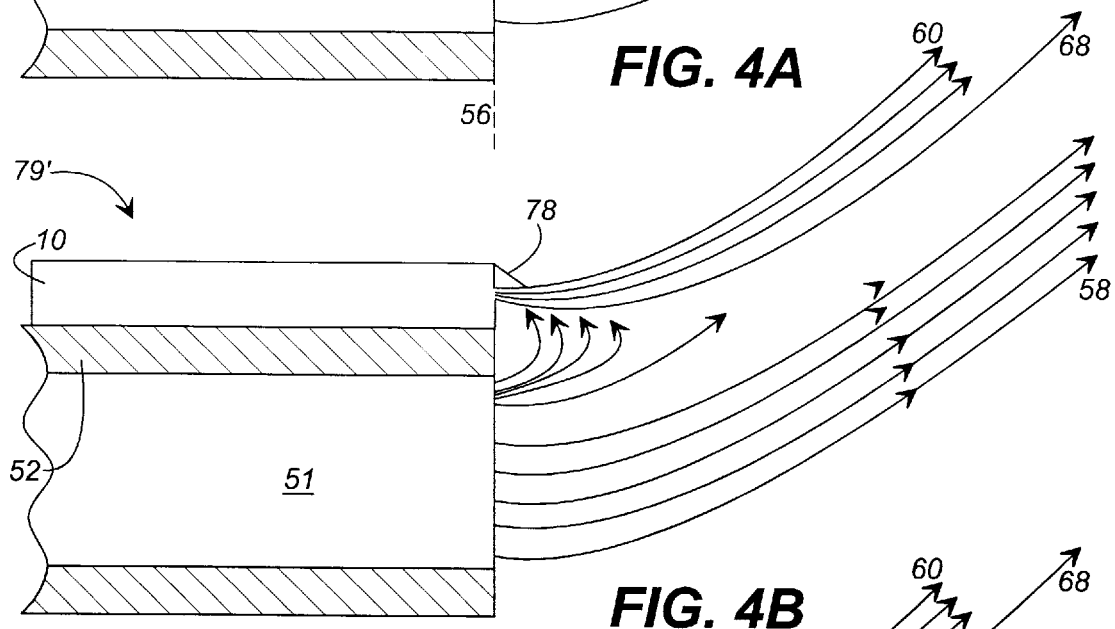
FIG. 4B is a schematic cross-sectional side view of an augmented synthetic jet vectoring system in operation, wherein the vectoring of the primary jet is augmented by deployment of a small flap on the external surface directly above the synthetic jet orifice.

FIG. 4B depicts a control synthetic jet actuator 10 and a primary jet actuator 51 in generally the same configuration 79 as in FIG. 4A. However, in the system 79' of FIG. 4B, instead of the wall 76b of the control synthetic jet actuator 10 being moved to deform the synthetic jet orifice 16, a flap 78 on the upper wall 76a is deployed. Similar to the moving of the lower front wall 76b, deployment of this flap 78 will greatly enhance the vectoring of the primary jet flow 58 when the synthetic control jet flow 60 interacts with the primary jet flow 58. This result is shown in FIG. 4B.

Figure 4C:
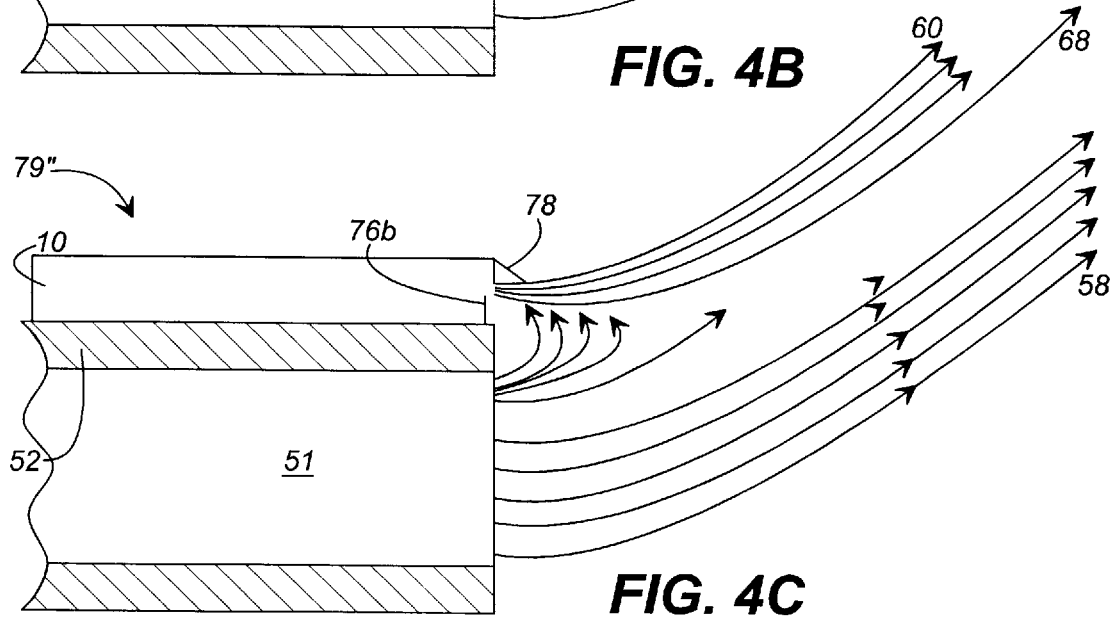
FIG. 4C is a schematic cross-sectional side view of an augmented synthetic jet vectoring system in operation, wherein the vectoring of the primary jet is augmented by deployment of a small flap on the external surface directly above the synthetic jet orifice and by deformation of the external surface surrounding the synthetic jet orifice.
Figure 5A:
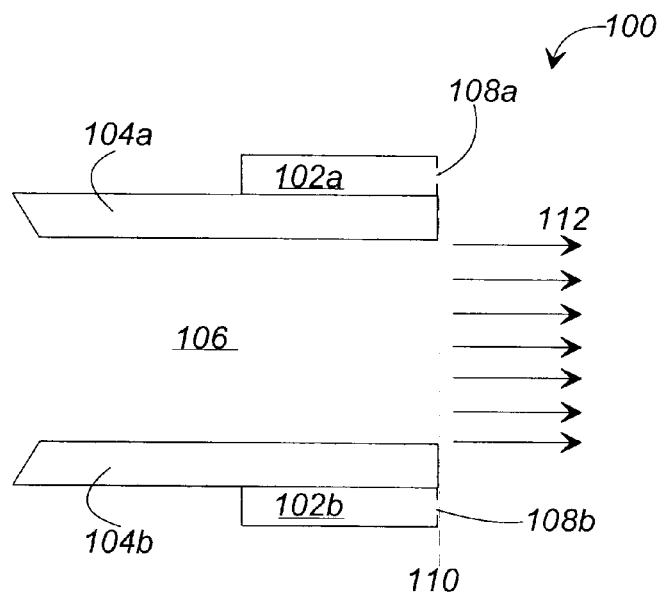
FIG. 5A is a schematic cross-sectional side view of a synthetic jet mixing system for use in mixing fluids.
Figure 5B:
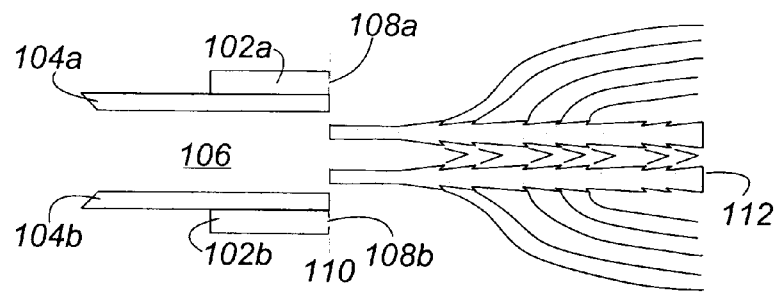
FIG. 5B is a schematic cross-sectional side view of the synthetic jet mixing system of FIG. 5A showing only a primary jet of fluid in operation.
Figure 5C:
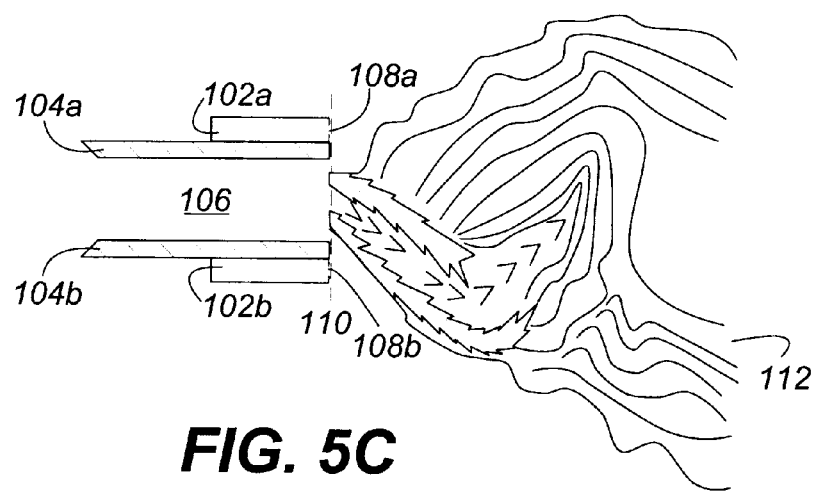
FIG. 5C is a schematic cross-sectional side view of the synthetic jet mixing system of FIG. 5A showing full operation and the alternating whipping motion of the primary jet caused by the two synthetic jet actuators.
Figure 6:
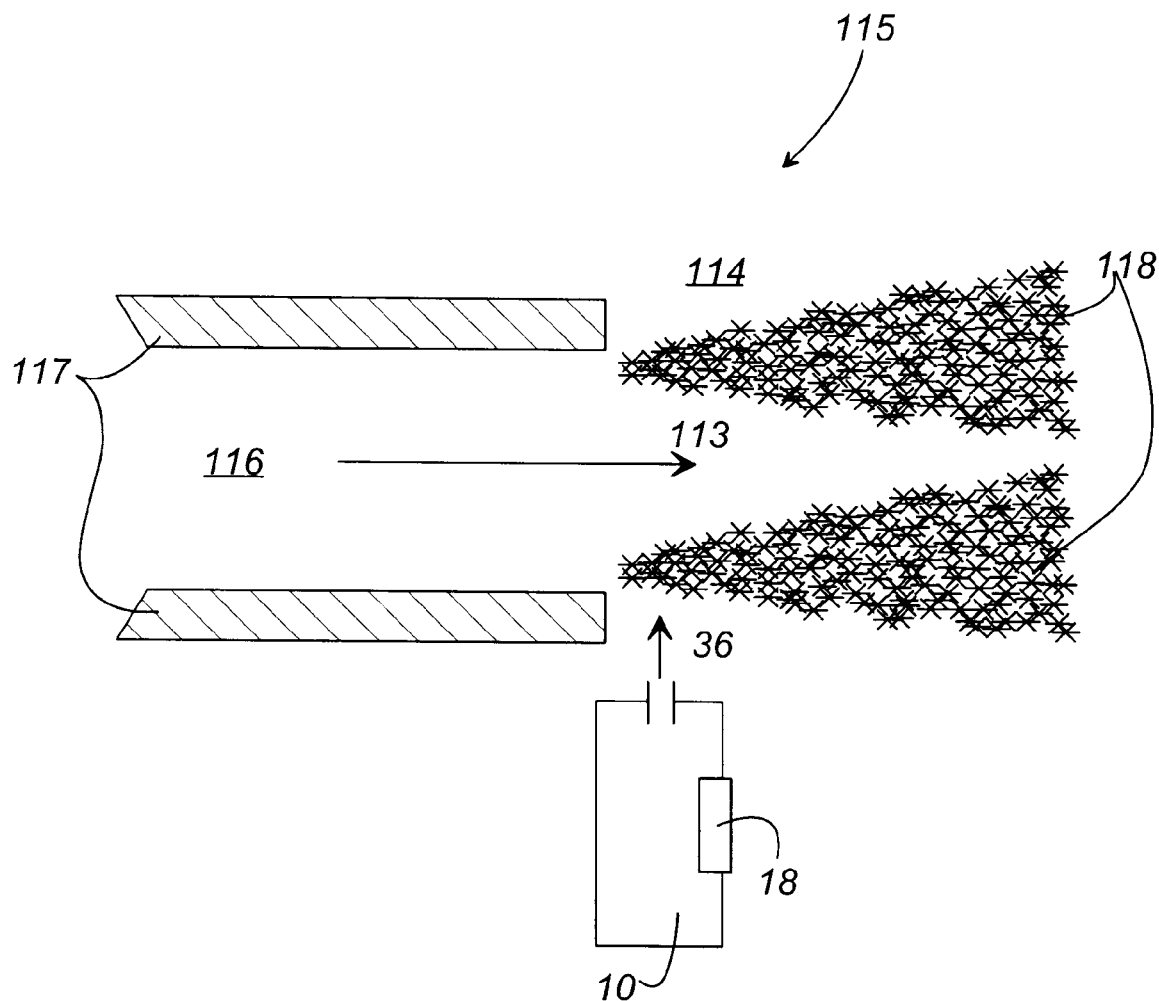
FIG. 6 is a schematic cross-sectional side view of a synthetic jet actuator mounted transverse to a primary jet to directly excite high frequency dissipative motions.

FIG. 4C depicts basically the same augmented control configuration 79" of a control synthetic jet actuator 10 and a primary jet actuator 51. However, in the system 79" of FIG. 4C, not only is a flap 78 deployed on the upper frontal wall 76a, but also the lower frontal wall 76b is moved backward. Use of both means of deformation of the orifice external surface will have even a greater impact on the path of the synthetic jet flow 60. Consequently, the effect the synthetic jet flow 60 has on the primary jet flow 58 will be even greater than if only one means of deforming the external surface about the orifice 16 was utilized.

C. Use of a Synthetic Jet to Vector Fluid Flow From Another Synthetic Jet

Figure 14:
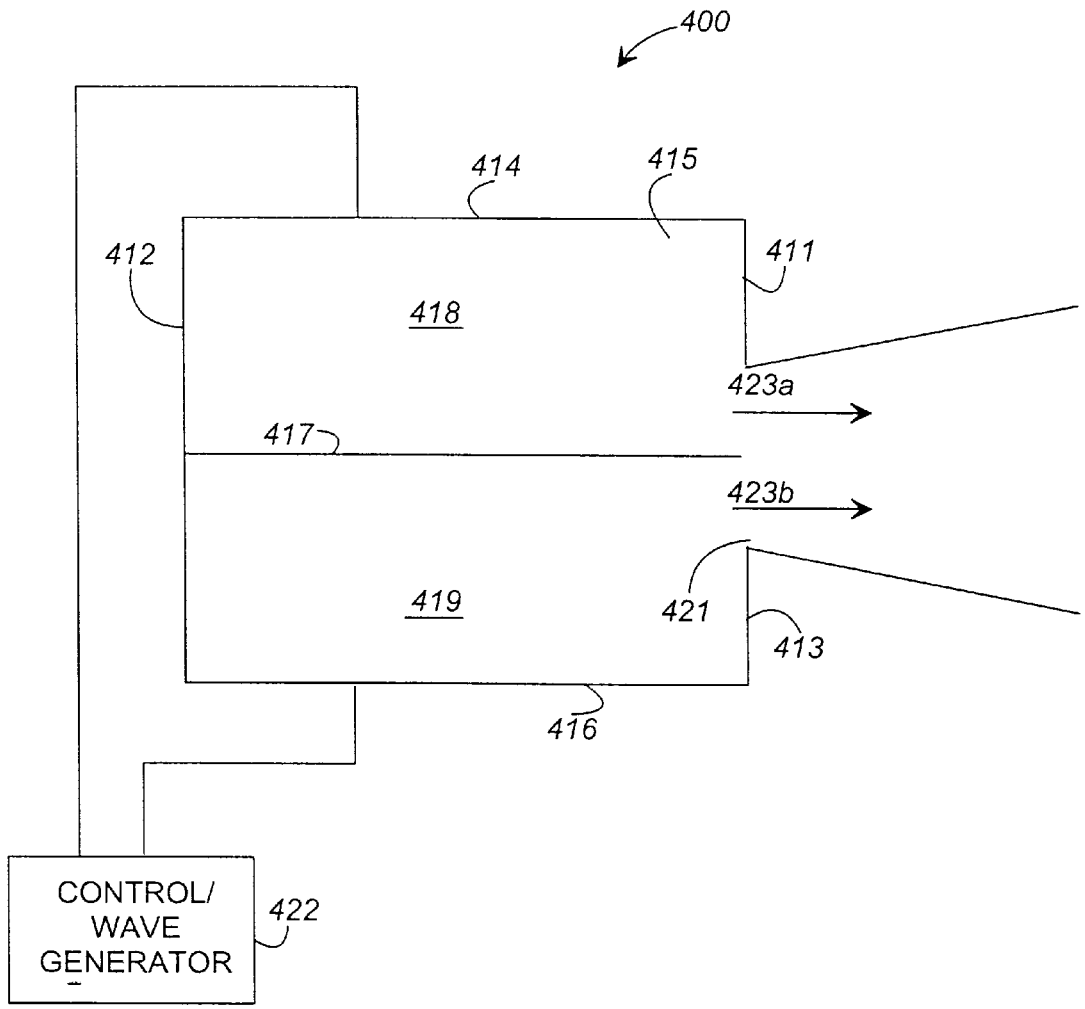
FIG. 14 is a schematic cross-sectional side view of a synthetic jet pair operated by a common control system.

A further embodiment of the present invention, having a controllable synthetic jet pair 410, is depicted in FIG. 14. A controllable synthetic jet pair 410 is preferably comprised of a rectangularly cubic housing 411. A rigid first housing wall 413 of the housing 411 has an orifice 421 of any geometric shape. Although not required, the orifice 421 in the preferred embodiment is centered on the first housing wall 413. A first flexible diaphragm 414 is securely attached to the first housing wall 413 such that this first diaphragm 414 comprises a wall of the housing 411. Opposed to this first diaphragm 414, in a parallel plane and also securely connected to the first housing wall 413, is a second flexible diaphragm 416. Securely attached to the two flexible diaphragms (414 and 416) and the first housing wall 413 is both a rear housing wall 415 and a fore housing wall (not shown). Opposed to the first housing wall 413, and in a parallel plane, is an opposite housing wall 412 securely attached to the first diaphragm 414, the second diaphragm 416, the rear wall 415, and the fore wall.

Spanning from the first housing wall 413 to the opposite housing wall 412 is a rigid chamber dividing wall 417. The chamber dividing wall 417 forms a plane parallel to both the first flexible diaphragm 414 and the second flexible diaphragm 416. Being interior to the housing 411, the chamber dividing wall 417 divides the housing 411 into two separate chambers: a first chamber 418, and a second chamber 419. Although it is not necessary to the present invention, the first chamber 418 and the second chamber 419 are depicted in FIG. 14 as roughly of equal volume.

As depicted in FIG. 14, the chamber dividing wall 417 divides the orifice 421 into two halves. The orifice 421 serves to connect both the first chamber 418 and the second chamber 419 to the exterior of the housing 411. As depicted in FIG. 14, the orifice 421 extends an equal distance above and below the chamber dividing wall 417. However, this is not a necessary feature of the present embodiment of this invention. The orifice 421, however, must connect both internal chambers 418 and 419 to the exterior of the housing 411.

Just as with the basic embodiment of the synthetic jet actuator 10, both the first flexible diaphragm 414 and the second flexible diaphragm 416 are suitably controlled such that they can change the volume of the first chamber 418 and the second chamber 419 respectively. Typically, a piezoelectric element is attached to each membrane 414, 416. Each piezoelectric element is then wired to a signal generator controlled by a computer or other logic device control system 422. However, any appropriate mechanism for separately actuating and controlling the diaphragms 414, 416 is included in the present invention.

This control system 422 is preferably able to oscillate the two flexible diaphragms 414 and 416 in time-harmonic motion. As the control system 422 causes the flexible diaphragms 414 and 416 to oscillate, fluid will be forced both into and out of the first 418 and second 419 chambers of the housing 411 by way of the orifice 421. With the time-harmonic motion of the diaphragms 414 and 416, a jet of fluid will be produced from both the upper and lower halves of the orifice 421, as depicted by arrows 423a and 423b. However, these two flows will quickly merge into a single fluid flow.

The particular configuration just described is not the only embodiment for applying the present invention. For example, two constant suction synthetic jets 511 as in FIG. 19 can be placed very near one-another in the same solid body 512. Proper control of the gate valve 523 can yield the same vectoring effect. Furthermore, with the embodiment of FIGS. 1A–1C, louvers may be situated in the first housing wall 413.

1. Operation

The operation of the present embodiment of this invention will now be described in detail with reference to FIG. 14 and FIG. 15. The separately controllable synthetic jet pair 400 basically comprises one synthetic jet placed directly adjacent to the other. As such, the two synthetic jets function exactly like the single synthetic jet actuator 10 of the first preferred embodiment (see FIG. 1). The difference with the present embodiment is that the two synthetic jets produce a stronger fluid flow. This is a result of their orifices being in such close proximity and the resulting cascading of the jets.

Figure 15:
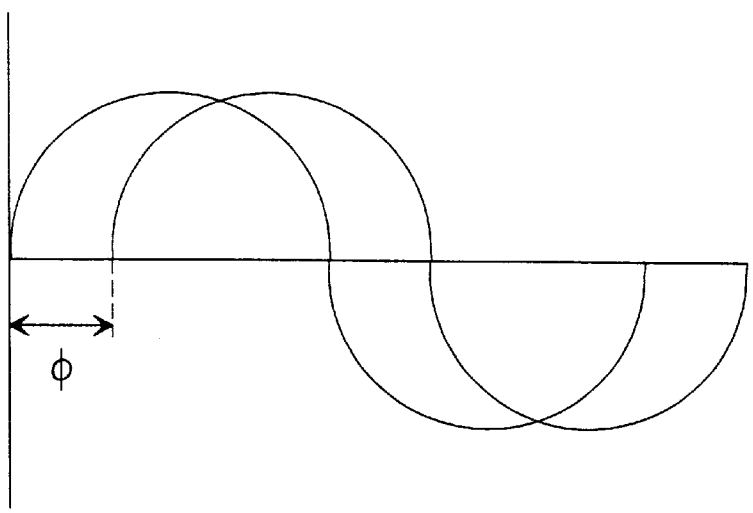
FIG. 15 is a graphical representation of two sinusoidal wave forms while out of phase with one another.
Figures 16A, 16G:
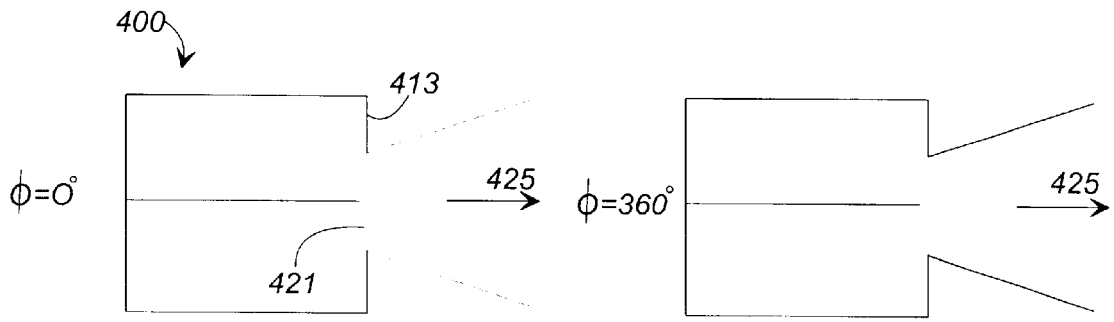
FIG. 16A is a schematic cross-sectional side view of a synthetic jet pair with flexible diaphragms operated in phase.
FIG. 16G is a schematic cross-sectional side view of a synthetic jet pair with flexible diaphragms operated exactly 360° out of phase.
Figure 16B:
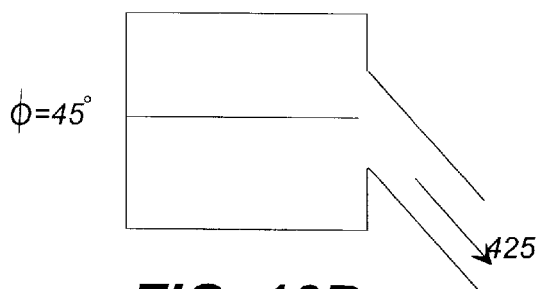
FIG. 16B is a schematic cross-sectional side view of a synthetic jet pair with flexible diaphragms operated approximately 45° out of phase.
Figure 16F:
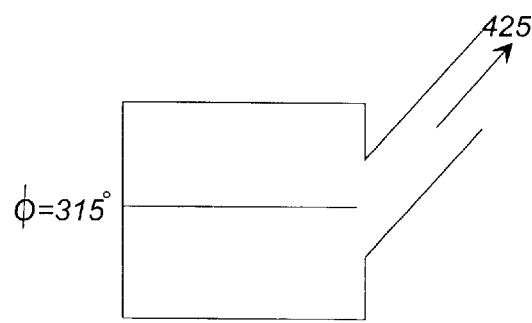
FIG. 16F is a schematic cross-sectional side view of a synthetic jet pair with flexible diaphragms operated approximately 315° out of phase.
Figure 16C:
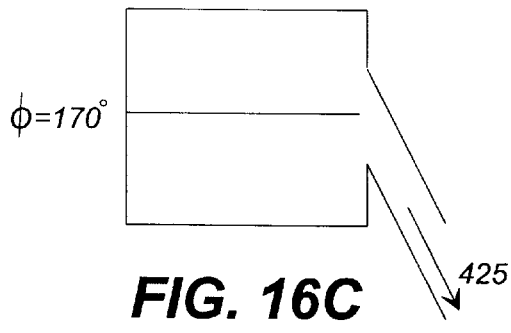
FIG. 16C is a schematic cross-section side view of a synthetic jet pair with flexible diaphragms operated approximately 170° out of phase.

As depicted in FIG. 15, the control system 422 can produce excitation of the first and second diaphragms 414 and 416 in a sinusoidal wave form, although such an excitation pattern is not required of this invention. The waves to this first and second diaphragms 414 and 416 do not have to be in phase. A phase angle between two waves may be defined by the greek letter $\Phi$. When this phase angle $\Phi$ is zero, both the first flexible diaphragm 414 and the second flexible diaphragm 416 oscillate in a symmetrical manner. As a consequence, a single jet of fluid 425 is produced normal to the first housing wall 413, as depicted in FIG. 16A. However, if the phase angle $\Phi$ is increased above zero degrees, 0°, the fluid emitted from the orifice 421 will no longer be normal to the first housing wall 413 of the housing 411. Instead, the fluid path 425 will tilt downward, towards the jet which is leading in phase toward the second flexible diaphragm 416, as depicted in FIG. 16B. With increasing phase angle $\Phi$, the fluid path 425 will continue on its downward tilt. As the phase angle $\Phi$ approaches 180°, the angle between a line normal to the first housing wall 413 and the fluid flow 425 will increase towards 90° (see FIG. 16C). However, when the phase angle $\Phi$ equals 180°, a definite fluid stream emitting from the orifice 421 will disappear. Instead, as shown in FIG. 16D, the fluid from the jet pair will have no ascertainable direction. The region outside the orifice 421 will become a region of turbulent and disruptive fluid 424.

Figure 16E:
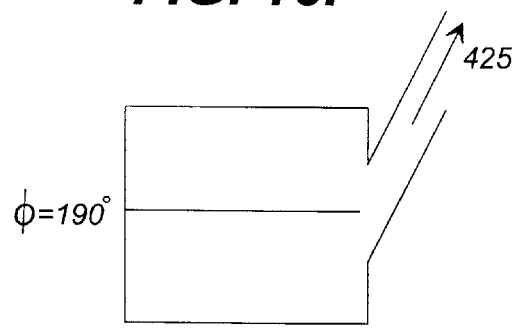
FIG. 16E is a schematic cross-sectional side view of a synthetic jet pair with flexible diaphragms operated approximately 190° out of phase.
Figure 16D:
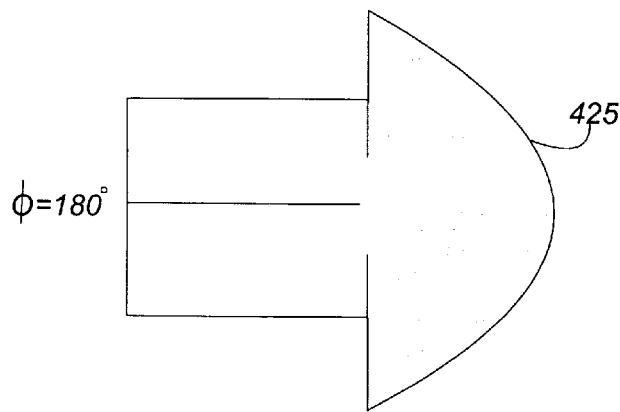
FIG. 16D is a schematic cross-sectional side view of a synthetic jet pair with flexible diaphragms operated exactly 180° out of phase.

As the phase angle $\Phi$ is increased above 180°, a defined fluid flow 425 will reappear at an angle near 90° above a line normal to the first housing wall 413 (see FIG. 16E). As the phase angle $\Phi$ is continually increased towards 360°, the angle between the path of the fluid flow 425 and the line normal to the right-most wall 413 of the housing 411 will decrease towards zero, as shown in FIG. 16F. When the phase angle reaches 360°, the jet of fluid 425 will again travel in a direction normal to the first housing wall 413, as depicted in FIG. 16G.

Thus, by manipulating the control system 422 and causing the first flexible diaphragm 414 the second flexible diaphragm 416 to operate at varying phase angles $\Phi$, the direction of the fluid flow 425 can be actively modified without the use of mechanical controls or other intrusive devices.

2. Preferred application

Figure 18A:
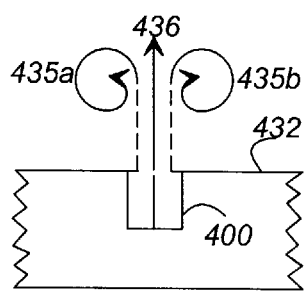
FIG. 18A is a schematic cross-sectional side view of an aircraft wing housing a synthetic jet pair whose diaphragms are in phase.

A preferred application of this preferred embodiment 400 is in aircraft flight control. Depicted in FIG. 29 is a typical configuration for an aircraft 431. In this preferred use, an array of separately controllable synthetic jet pairs 430 are embedded in an aircraft wing 432. Each of the synthetic jet pairs are embedded in the wing 432 with their orifice 421 in the upper surface of the wing 432, as depicted in FIG. 18A. When the aircraft 431 is in flight, the controllable synthetic jet pair 400 can be turned on and pairs of vortices 435a and 435b will be shed from a jet plume 436 (as shown in FIG. 18A).

Single and multiple synthetic jet actuator pairs 400,430 can be used for aerodynamic applications as active "vortex generators". In current applications, vortex generators are small metal tabs that are placed on aerodynamic surfaces (such as wings 432) to present flow separation and loss of lift. These vortex generators typically induce a pair of counter-rotating longitudinal vortices (in the direction of the flow over the surface) that help to keep the boundary layer attached, at the cost of increased drag. Clearly, because these devices are passive, their effect cannot be regulated and they cannot be removed when they are not needed. At the very basic application level, synthetic jet 436 that issue normal to the surface of a wing 432 can replace these tabs. It is well known that a jet 436 issuing into a cross stream over a surface leads to the appearance of two counter-rotating vortices 435a and 435b similar to the effect of a solid vortex generator. These jet actuators 400 clearly have the advantage that their effect can be regulated by controlling their strength and, furthermore, they can be completely turned off when they are not necessary.

Another very important application stems from the fact that pairs (or larger groups) of synthetic jet 400 can be used in a mode that allows for their vectoring. This means they can be vectored in a plane that is normal to the surface and to the direction of the cross flow (as shown in the figure). It is well known that when a conventional jet is vectored in a similar flow geometry it leads to weakening of one of the vortices 435b in the longitudinal vortex pair and strengthening of the other 435a. In particular, at large angles relative to the normal the jet 436 leads to the formation of a single longitudinal vortex, the sense of which depends on whether the jet is tilted either to the right or left of the normal to the surface (in the plane that is normal to the surface and to the direction of the cross flow). This means that in applications where longitudinal vortices are used for lift augmentation (e.g. delta wings), that the utilization of synthetic jets can either enhance or diminish the delta wings), that the utilization of synthetic jets can either enhance or diminish the strength of these lift augmenting vortices for example, on a delta wing differential strength of the two main vortices (on the right and left of the main axis of the airplane) can enable roll maneuvering without the use of control surfaces. Enhancing both primary vortices can lead to lift enhancement without the use of control surfaces, etc.

It should be noted that this effect makes use of the continuous nature of the synthetic jet and could also be achieved by using conventional control jet. However, it is far more difficult to control conventional jets so that they perform as groups of synthetic jets.

Figure 17:
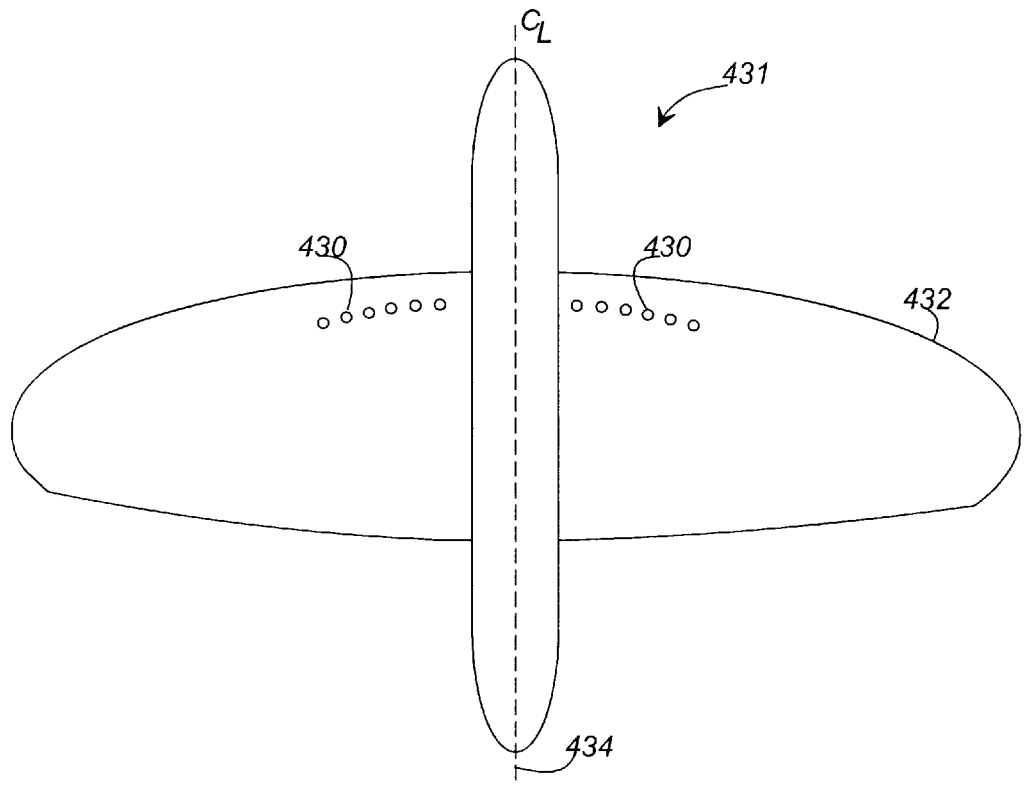
FIG. 17 is a schematic plan view of a synthetic aircraft housing synthetic jet pairs in the wing.
Figure 18B:
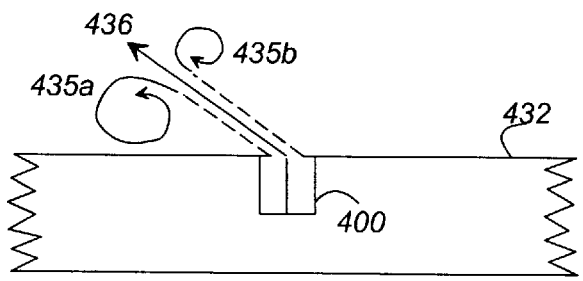
FIG. 18B is a schematic cross-sectional side view of an aircraft wing housing a synthetic jet pair whose diaphragms are out of phase at some angle between zero and 180°.

While the applications just described and depicted in FIG. 17 through FIG. 18B are the preferred applications of this preferred embodiment 400, one skilled in the art will see many other applications for this preferred embodiment 400 of the present invention. For example, the concept of producing strong vortices of one sign can be used to suppress wing tip vortices at take-off and landing. The synthetic jet actuator pairs need only be placed near wing tips and angled to produce a vortex trail opposite in sign to the wing tip vortices nearest the synthetic jet actuator. This disclosure and the claims provided herein are meant to include such obvious modifications.

Additionally, other synthetic jet actuators could be placed side-by-side to reflect the features described above. For example, synthetic jet actuators with louvers (described below) or constant suction synthetic jet actuators (described below) would also produce the above-described features.

II. Second Preferred Embodiment: Synthetic Jets with Louvers

In the first preferred embodiment, the synthetic jet actuator 10 had a flexible diaphragm 18 for forcing fluid into and out of a chamber 14. The flexible diaphragm 18 is described as being controlled by a control system 24 which may comprise, inter alia, a processor or logic circuitry. The synthetic jet actuator, however, is not limited to the use of just a flexible diaphragm. For instance, in some applications, a moveable piston head may be preferred. In these applications, the piston head would be positioned within the chamber 14 opposite the orifice 16 and would be moved by any suitable mechanism, such as a piston rod, so as to reciprocate within the chamber 14.

As opposed to the flexible diaphragm 18, the piston head would be able to move a larger mass of fluid and thus be able to produce fluid flows having larger momentums. With these stronger fluid flows, the synthetic jet actuator 10 in turn may operate more effectively in vectoring primary fluid flows, in altering aerodynamic surfaces, in promoting mixing of fluids, and in aiding heat transfer to or from a fluid. The use of a piston rather than the flexible diaphragm 18 will have other advantages and benefits which will be apparent to those skilled in the art.

A synthetic jet actuator, such as actuator 10 shown in FIGS. 1A to 1C, can be modified to operate more efficiently at very high speeds. At a very high speed, after the fluid is forced out of the chamber 14 through the orifice 16, the diaphragm 18 or piston then quickly begins to move away from the orifice 16 and attempts to draw fluid back into the chamber 14. A limitation on the withdrawal of fluid back into the chamber 14 can decrease the force of the jet 36 and the effectiveness of the jet actuator 10. Furthermore, if the fluid is compressible, the quick retraction of the flexible diaphragm 18 creates a vacuum within the chamber 14. As a result, the fluid that is drawn into the chamber 14 has less mass than that previously forced out of the chamber 14 and the subsequent jet 36 will, consequently, have less momentum. The inability to force an adequate mass of fluid into the chamber 14 therefore decreases the effectiveness of the jet actuator 10.

Figure 7A:
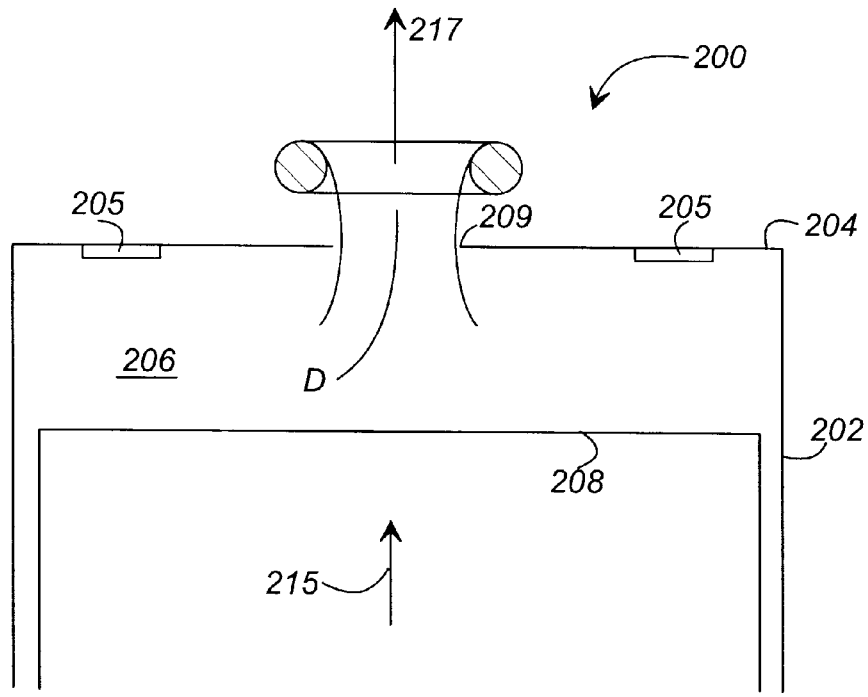
FIG. 7A is a schematic cross-sectional side view of a synthetic jet actuator having a pair of outwardly-opening louvers in a closed position while a piston moves away from an orifice.
Figure 7B:
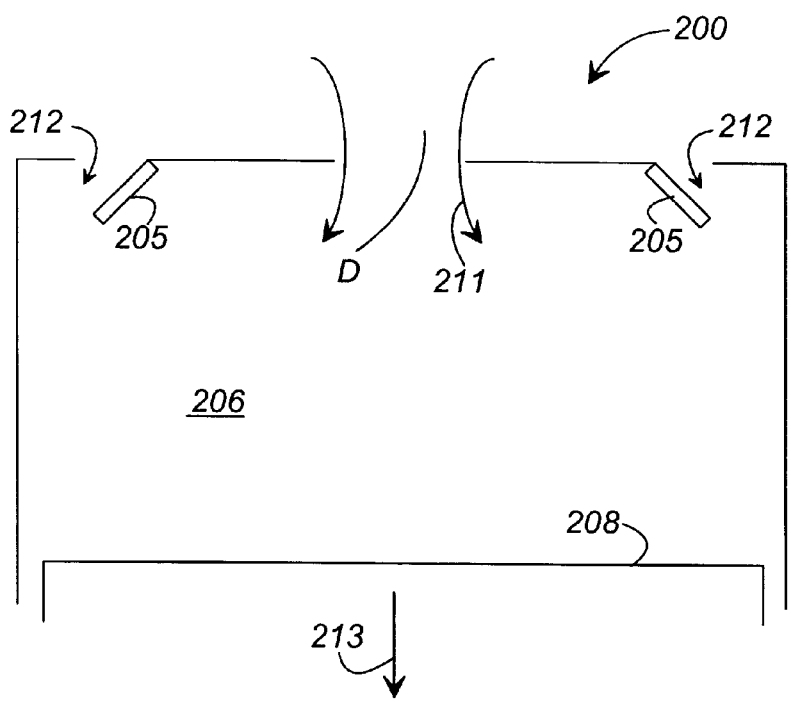
FIG. 7B is a schematic cross-sectional side view of the synthetic jet actuator of FIG. 7A illustrating the louvers in an open position while the piston moves toward the orifice.

A synthetic jet actuator 200 which can effectively operate at high speeds is shown in FIGS. 7A and 7B and comprises a housing 202 defining an interior chamber 206. The housing 202 has an upper wall 204 with an orifice 209 and at least one louver 205. In the preferred embodiment, the jet actuator 200 preferably has a plurality of louvers 205. Only two louvers 205 have been shown in the figures in order to simplify the description. The synthetic jet actuator 200 also comprises a piston head 208 for reciprocating toward and away from the orifice 209 at a prescribed rate and stroke distance. The invention is not limited to any particular stroke distance or rate whereby the rate and stroke distance may be adjusted according to the particular needs of an application.

FIG. 7A illustrates the jet actuator 200 at a time when the piston 208 is moving toward the orifice 209. As shown in the figure, the louvers 205 are in a closed position whereby a fluid flow 217 is forced out only through the orifice 209. The jet 217 produced by the jet actuator 200 is similar to the jet 36 produced by the jet actuator 10 and produces vortex sheets which roll into vortices and move away from the orifice 209.

With reference to FIG. 7B, the louvers 205 open during the time that the piston 208 moves away from the orifice 209. With the louvers 205 opened, fluid may enter the chamber 206 not only through the orifice 209 in flow 211 but also through the openings adjacent to the louvers 205 in flows 212. These additional fluid flows 212 substantially increase the surface area by which fluid may enter the jet actuator 200 and enable the jet actuator 200 to force a sufficient amount of fluid into the chamber 206 while the piston 208 moves away from the orifice 209. Since the jet actuator 200 is able to intake sufficient amounts of fluid within the chamber 206, the jet actuator 200 is able to maintain the momentum of the fluid flow 217 in subsequent strokes of the piston 208.

Figure 8A:
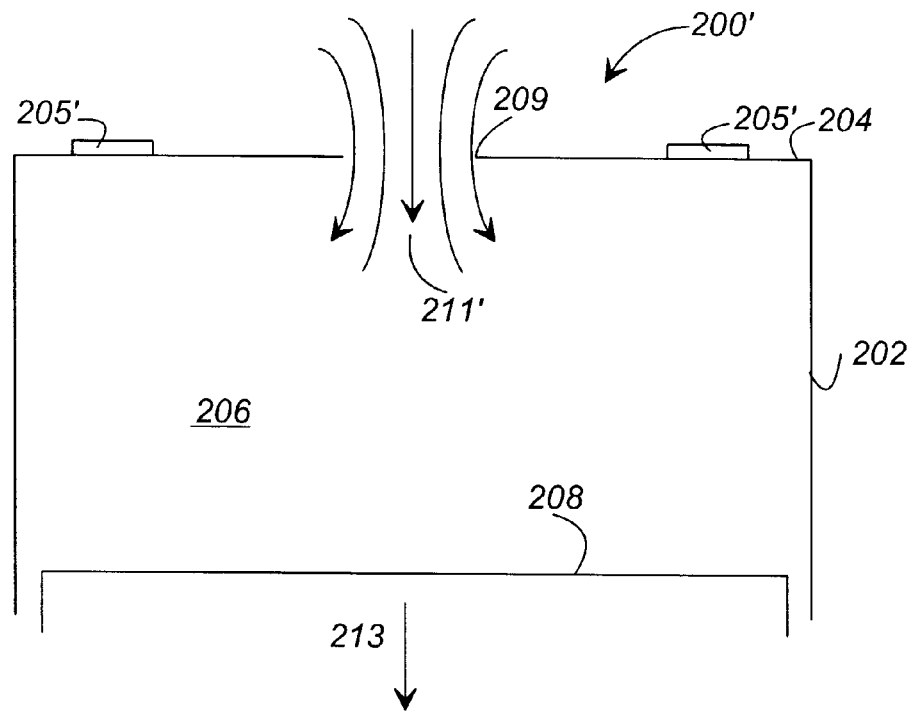
FIG. 8A is a schematic cross-sectional side view of a synthetic jet actuator having a pair of inwardly-opening louvers placed in a closed position while a piston moves toward an orifice.
Figure 8B:
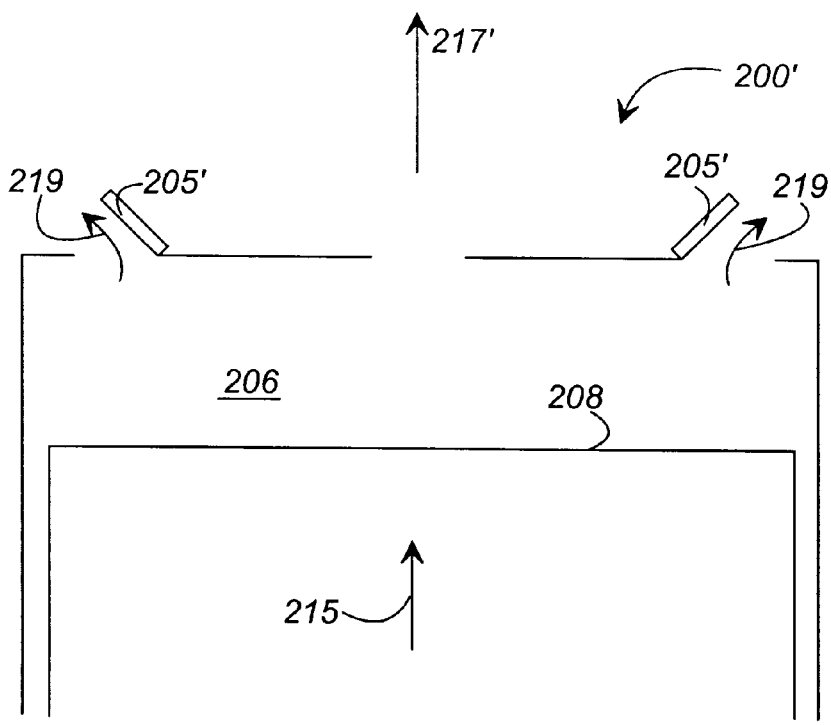
FIG. 8B is a schematic cross-sectional side view of the synthetic jet actuator of FIG. 8A illustrating the louvers in an open position while the piston moves away from the orifice.
Figure 9A:
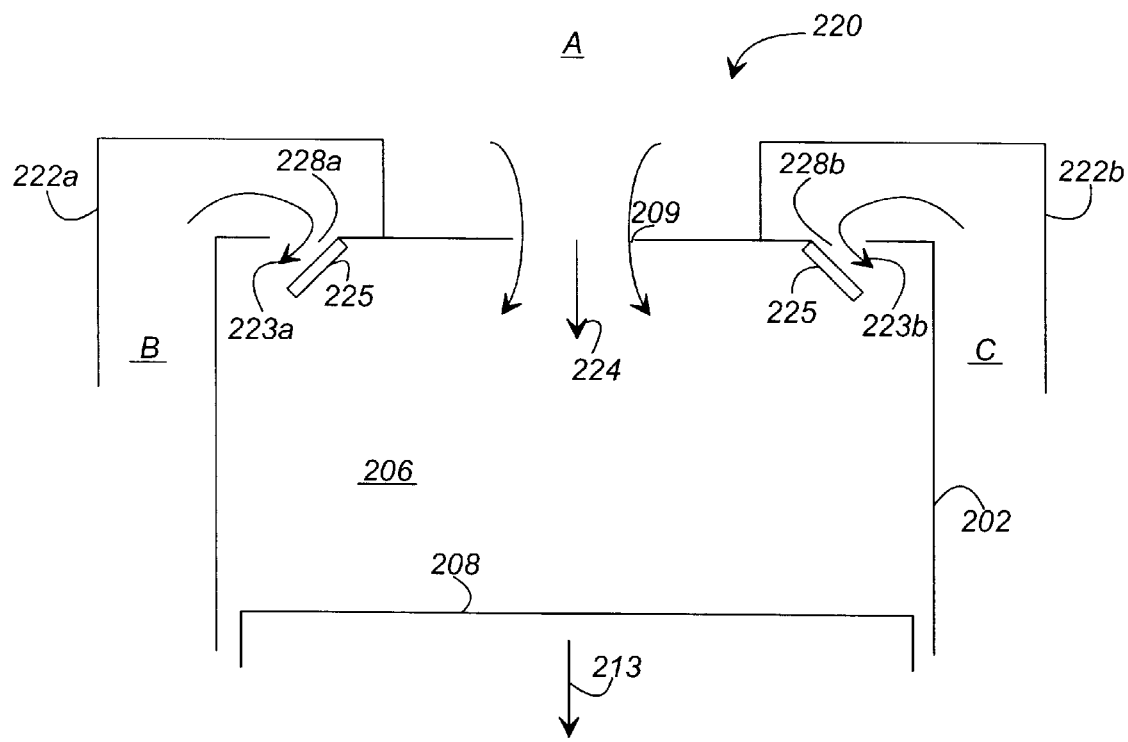
FIG. 9A is a schematic cross-sectional side view of a synthetic jet actuator used to mix at least two different fluids and illustrates a piston of the actuator drawing fluid into the actuator.
Figure 9B:
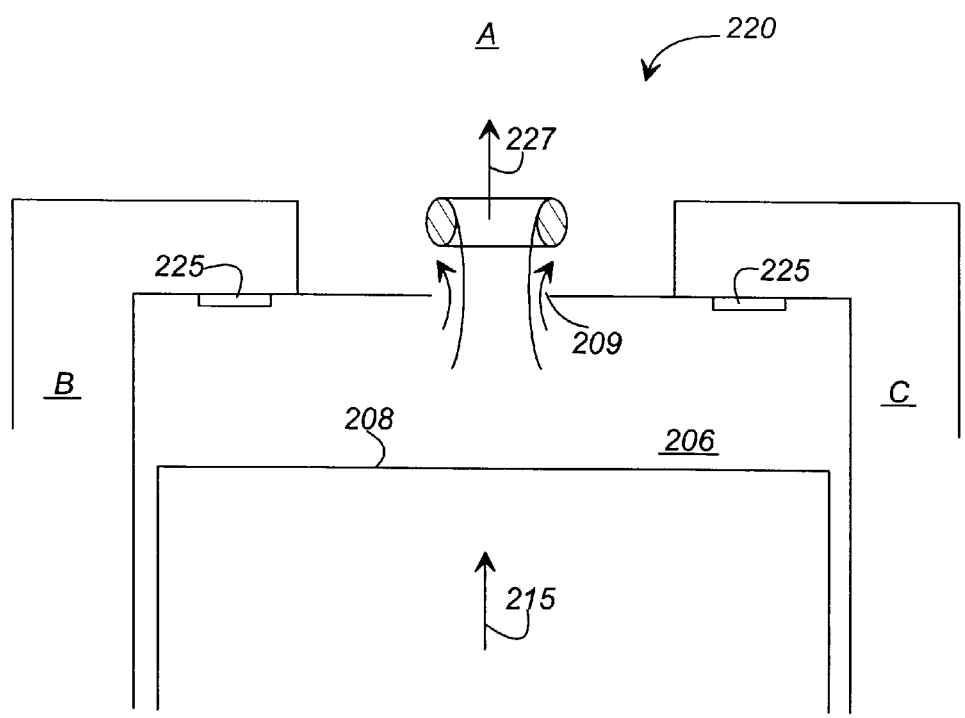
FIG. 9B is a schematic cross-sectional side view of the synthetic jet actuator of FIG. 9A illustrating the piston forcing a mixture of fluids out of the actuator.

In some applications, fluid flow 211 with larger momentum into the chamber 206 of the jet actuator 200 and a smaller flow out of the orifice 209 may be desirable. FIGS. 8A and 8B illustrate a jet actuator 200' which has a plurality of louvers 205' which become opened while the piston 208 moves toward the orifice 209 and become closed while the piston 208 moves away from the orifice 209. As a result, during the down stroke of the piston 208, as shown in FIG. 8A, a large fluid flow 211' is forced through the orifice 209. During the up stroke of the piston 208, on the other hand, the louvers 205' become opened and fluid is permitted to exit the chamber 206 not only through orifice 209 in flow 217' but also through the openings adjacent louvers 205' in flows 219. Since the fluid has a greater surface area in which to exit the chamber 206, the momentum of the flow 217' is substantially decreased.

As should be apparent from FIGS. 7A, 7B, 8A, and 8B, the amount of fluid that is drawn into the chamber 206 or which is forced out of the chamber 206 may be altered by using one or more louvers. With the jet actuator 200, the louvers 205 increase the amount of fluid that enters the chamber 206 while the louvers 205' in jet actuator 200' decrease the momentum of the jet 217' exiting the orifice 209. By adjusting the size and number of the openings covered by the plurality of louvers, the flow rates in and out of the chamber 206 may be altered.

A synthetic jet having louvers is useful in many applications. In particular, a louvered synthetic jet actuator may be used to vector other fluid flows or other synthetic jet actuators, as described above. The construction of such apparatuses would be identical to the construction described above, with the exception that one or more louvers should be present in a wall of the synthetic jet actuator.

A. Different types of louvers

The louvers in a synthetic jet actuator are one-way valves that permit fluid flow in one direction but which block flow in the opposite direction. As shown above in synthetic jet actuators 200 and 200', the louvers can permit fluid flow either into the chamber 206 or out of the chamber 206. The invention can be implemented with any suitable type of louver, such as either an active louver or a passive louver. A passive louver is simply a flap or valve which is hinged so as to open with fluid flow in one direction and which closes tight against the housing 202 of the jet actuator with fluid flow in the opposite direction.

Figure 10A:
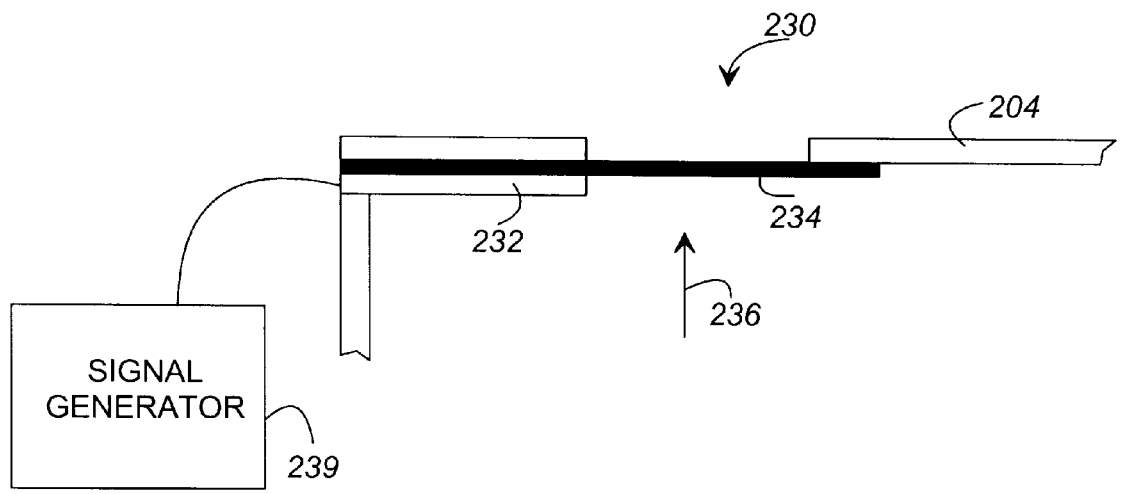
FIG. 10A is a schematic cross-sectional side view of an active louver in a closed position.
Figure 10B:
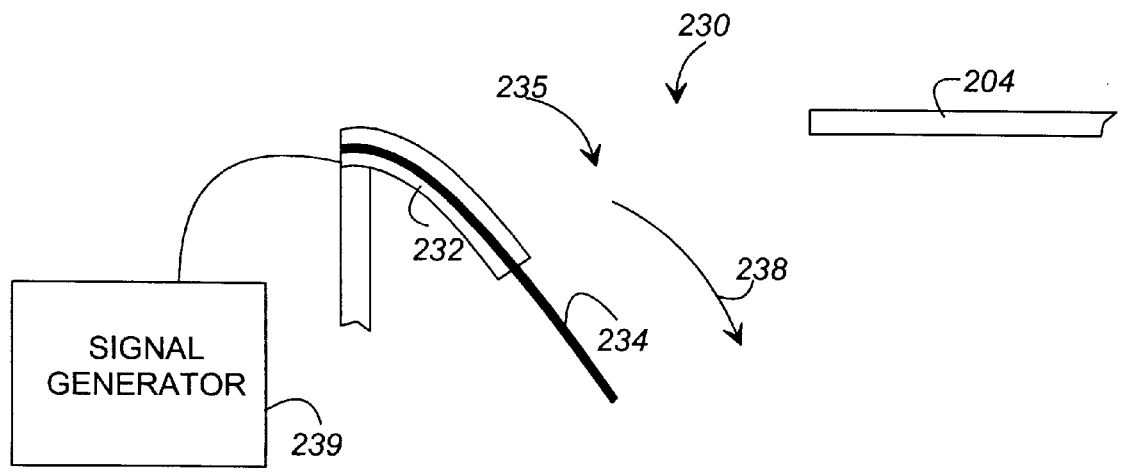
FIG. 10B is a schematic cross-sectional side view of the active louver of FIG. 10A in an open position.

An active louver, such as louver 230 shown in FIGS. 10A and 10B, becomes opened or closed with the assistance of a force other than just the force of a fluid flow. In the example shown in FIGS. 10A and 10B, this other force may be generated by a piezo-electric material 232. With reference to FIG. 10A, when the louver 230 is in a closed state, a semi-rigid member 234 is in intimate contact with wall 204 of the synthetic jet actuator. The semi-rigid member 234 preferably overlaps a portion of the wall 204 so that the louver 230 remains in a closed state even when a fluid flow 236 contacts the louver 230. As is known to those skilled in the art, the piezo-electric material 232 will deflect upon the application of an electrical signal. Thus, an electrical signal can be applied to the piezo-electric material 232 from a signal generator 239 to cause the piezo-electric material to deflect down to an open state shown in FIG. 10B. In the open state, a fluid flow 238 is permitted to travel through an opening 235 and exit the chamber or, as depicted in this example, enter the chamber. The exact manner in which an electrical signal is applied to the piezo-electric material 232 is known to those skilled in the art and, accordingly, has been omitted from the drawings in order to simplify the description of the invention.

B. Louvered jet as a pump

Figure 11A:
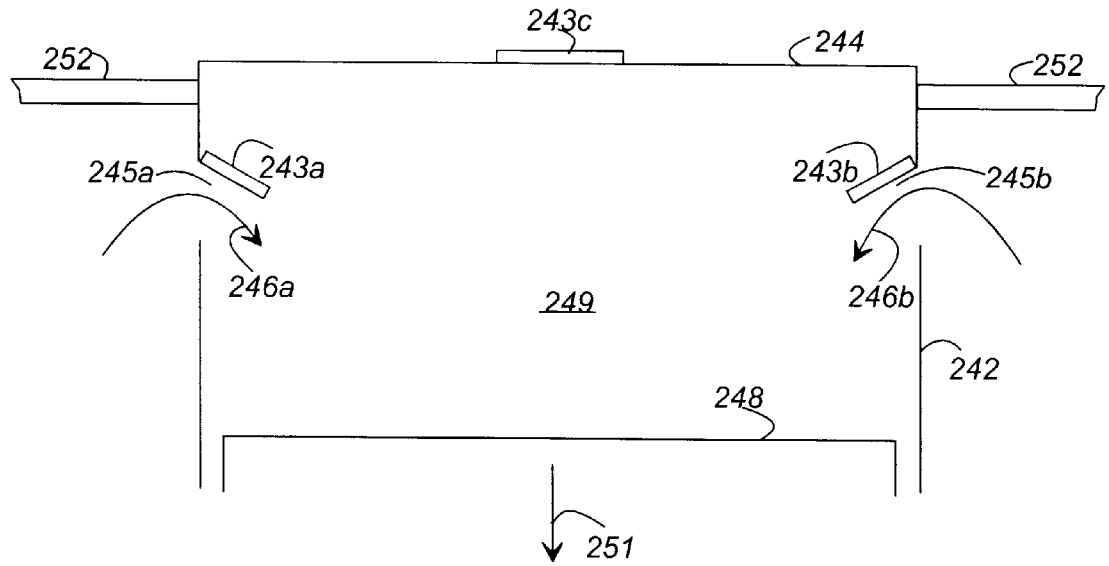
FIG. 11A is a schematic cross-sectional side view of a synthetic jet actuator which is used as a pump and illustrates a piston drawing fluid into the actuator.
Figure 11B:
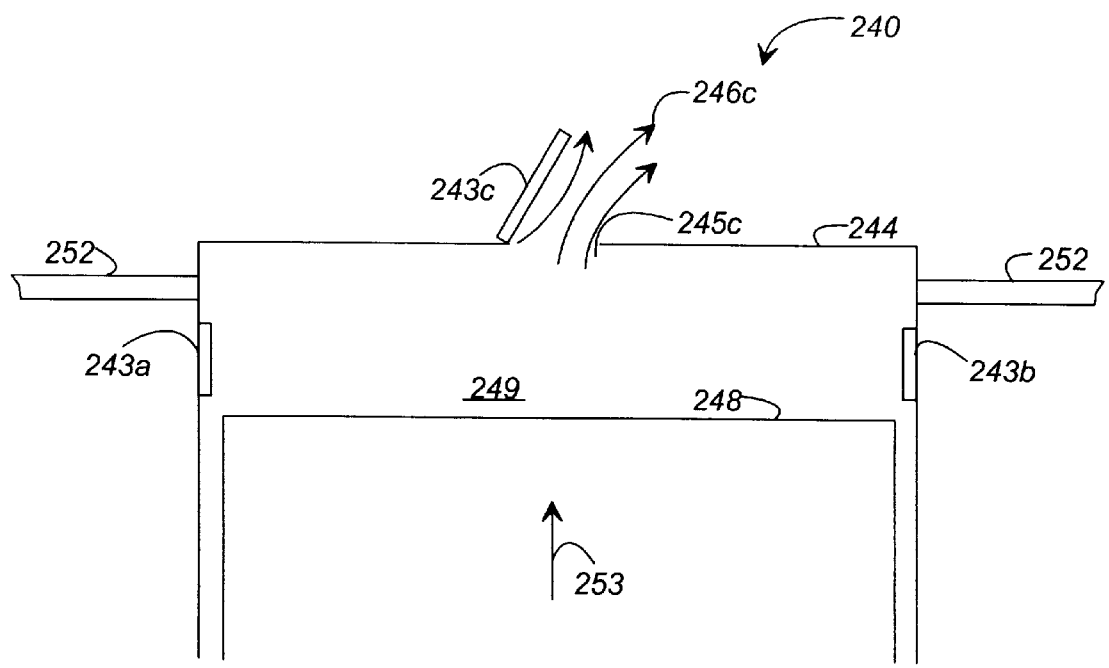
FIG. 11B is a schematic cross-sectional side view of the synthetic jet actuator of FIG. 11A illustrating the piston forcing fluid out of the actuator.
Figure 12:
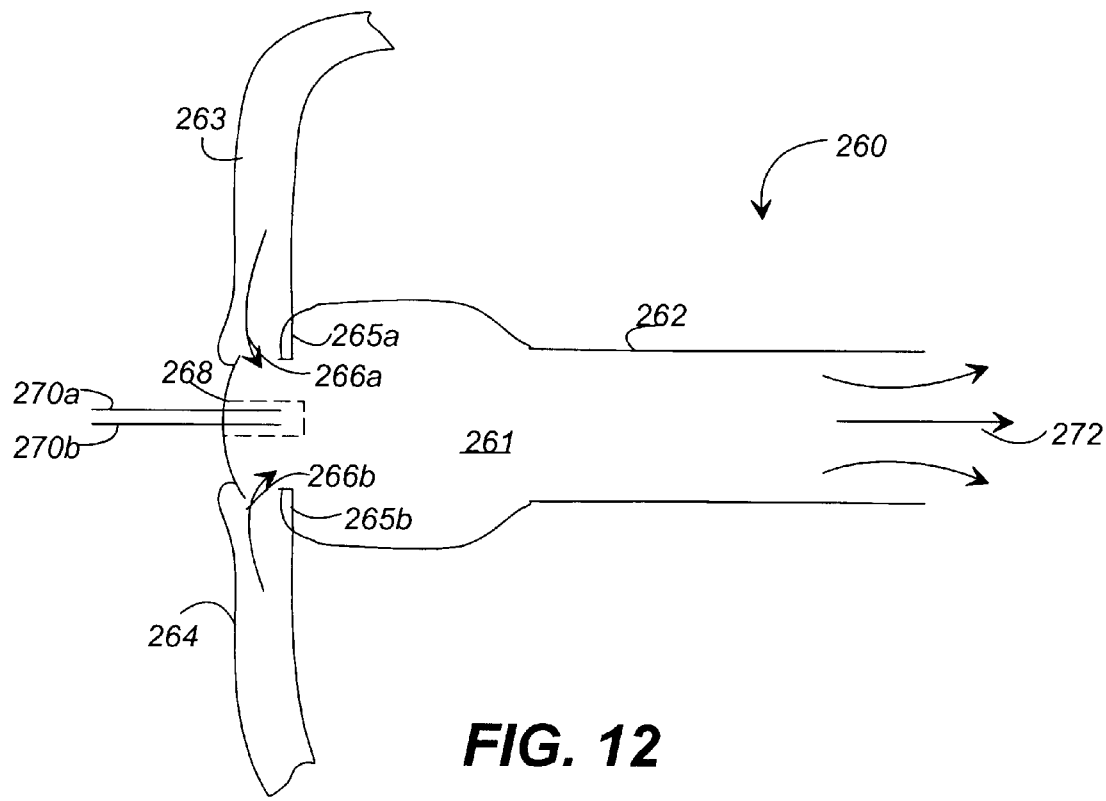
FIG. 12 is a schematic cross-sectional side view of a jet having at least one louver for introducing combustible fuel into a chamber.
Figure 13:
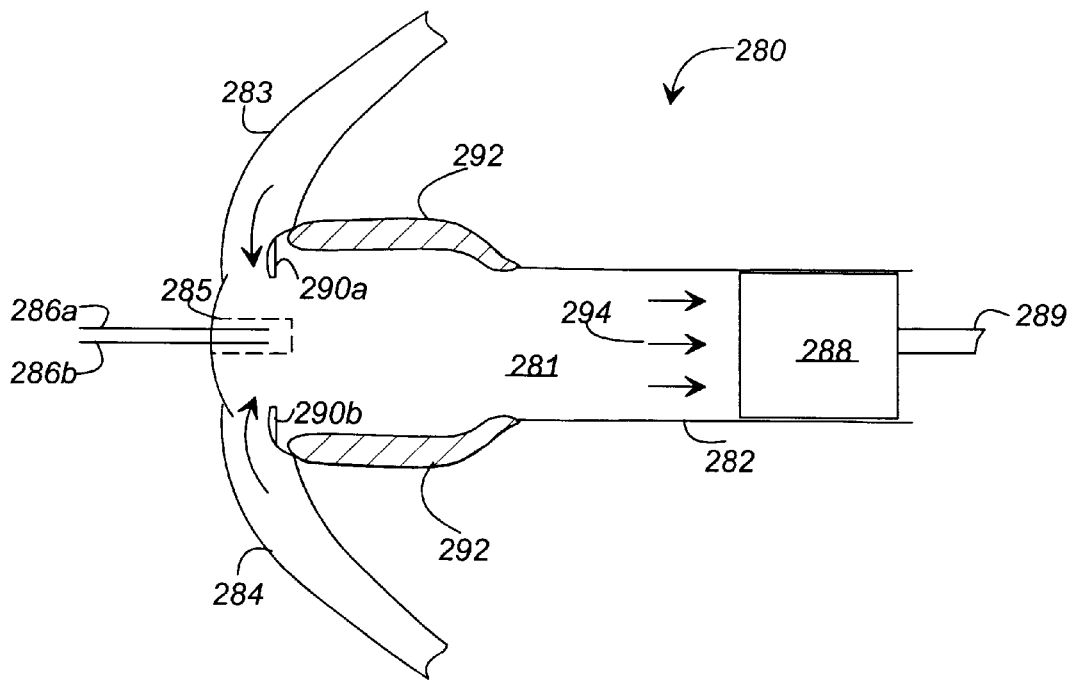
FIG. 13 is a schematic cross-sectional side view of a jet having at least one louver for introducing an oxidizer of a combustion process which causes movement of a piston rod.

With reference to FIGS. 11A and 11B, a synthetic jet actuator 240 according to the invention may also operate as a pump transferring fluid from one side of a barrier 252 to the opposite side of the barrier 252. The jet actuator 240 comprises a housing 242 defining an interior chamber 249 and has a piston 248 reciprocating within the chamber 249. While the piston 248 is moving in direction 251, as shown in FIG. 11A, louvers 243a and 243b are open and permit fluid flows 246a and 246b to enter through openings 245a and 245b into the chamber 249. As the piston 248 moves in direction 253, the louvers 243a and 243b become closed and louver 243c opens, thereby permitting a fluid flow 246c to exit through opening 245c in wall 244. The reciprocation of the piston 248 within the actuator 240 therefore pumps fluid from one side of the barrier 252 to the opposite side of barrier 252.

III. Third Preferred Embodiment: Constant Suction

The synthetic jet actuator 10 described in FIGS. 1A–1C is not the only apparatus which can be used to form a synthetic jet. A synthetic jet can be formed, for example, by using the arrangement shown in FIG. 19 where constant suction is applied to the center tube and pulsed blowing to the outer tube. This device is particularly useful for the application of embedding a synthetic jet actuator into a solid body 512.

Figure 19:
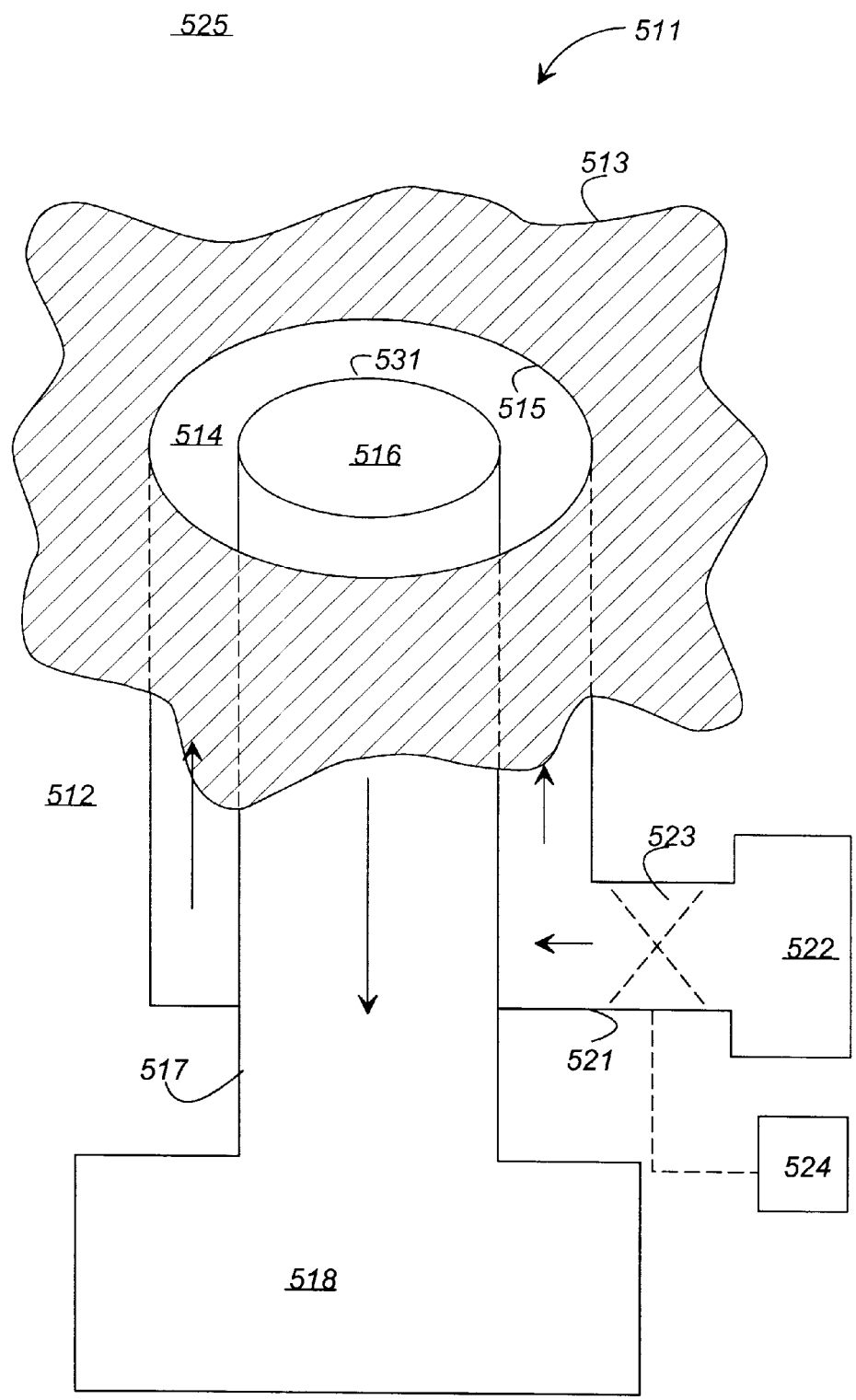
FIG. 19 is a cut-away perspective view of a second embodiment of a synthetic jet producing device

The preferred embodiment 511 is comprised of an outer cylindrical section 514 made similar to a pipe, and an inner cylindrical section 516. Although not limited to such an embodiment, the outer cylindrical section 514 and the inner cylindrical section 516 as depicted in FIG. 19 are concentric and approximately perpendicular to the outer surface 513 of the solid body 512. Additionally, the outer cylindrical section 514 is embedded into the solid body 512 such that an upper rim 515 of the outer section is contiguous with the outer surface 513. By contrast, the inner cylindrical section 516 has an upper rim 531 which is some small distance below the outer surface 513 of the solid body 512. The particular diameters given to the outer cylindrical section 514, or pipe, and the inner cylindrical section 516, or pipe, are not critical to the present invention.

The outer cylindrical section 514 should preferably be connected by fluidic piping 521 to a fluid source 522. Along the path of the fluidic piping 521 is valve 523 which permits control of the fluid flow through the fluidic piping 521. The present invention, however, is not intended to be limited to the use of a valve 523 only. Any equivalent mechanism for stopping and restarting the flow of fluid would also function adequately and is included in the present invention.

In operation, the valve 523 should preferably alternately stop and then release fluid through the fluidic piping 521 and into the outer cylinder 514. This "on-off" operation is controlled by a suitable control system 524, such as a microcomputer or other logic device. The frequency at which the control system 524 causes the gate valve 523 to operate should preferably be adjustable in order to control effectively the operation of the synthetic jet actuator. A computer control system would easily provide this level of control.

The inner cylindrical section 516 is preferably connected by fluidic piping 517 to a suction mechanism 518. Such a suction mechanism 518 may comprise a vacuum, a pump, or any other appropriate mechanism for providing a constant suction. As indicated by the name of this preferred embodiment, the suction mechanism 518 operates constantly during operation of the synthetic jet actuator 511 and the removed fluid can be pumped back into the blowing section.

Figure 20A:
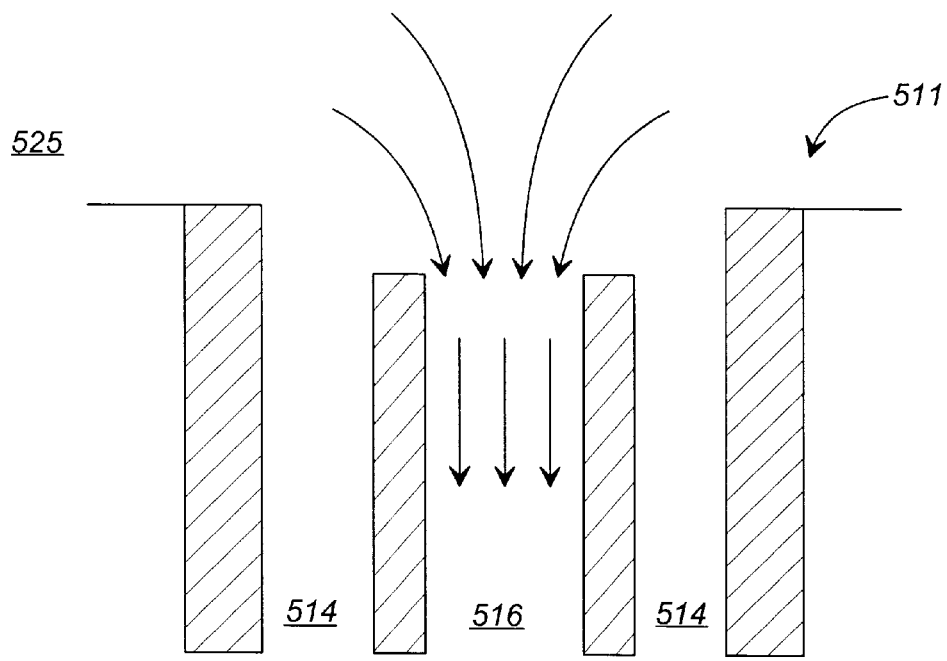
FIG. 20A is a schematic side-view of a second embodiment of a synthetic jet producing device in a first mode of operation where fluid is drawn in through the embodiment.

Therefore, in operation, the suction mechanism 518 creates a constant suction on an ambient fluid 525 above the outer surface 513 of the solid body 512. This action creates a constant flow of the ambient fluid 525 into the inner cylindrical section 516 and through the fluidic piping 517. The operation of the constant suction synthetic jet 511 when ambient fluid 525 is being pulled into the inner cylindrical section 516 is depicted in FIG. 20A. In FIG. 20A, the gate valve 523 is closed such that no fluid is ejected through the outer cylindrical section 514. This particular mode of operation is very much like the synthetic jet actuator 10 of FIGS. 1A–1C when the diaphragm or piston withdraws from the housing 11, thereby increasing the volume of the chamber 14.

Figure 20B:
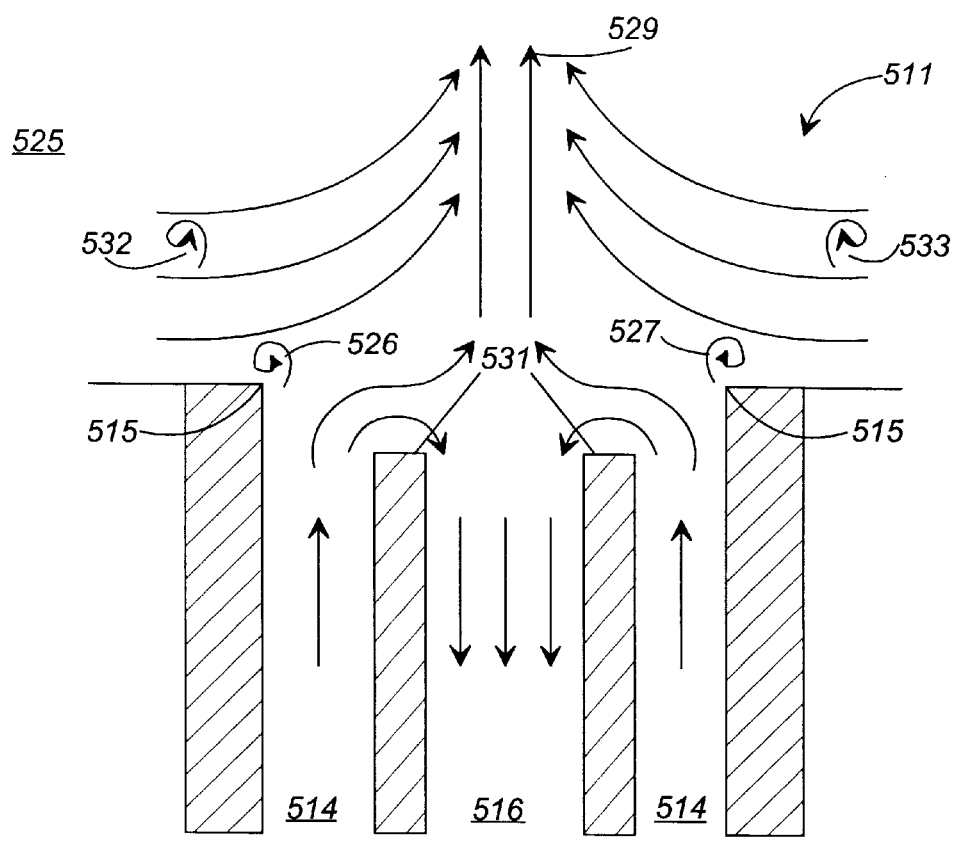
FIG. 20B is a schematic side-view of a second embodiment of a synthetic jet producing device in a second mode of operation which produces a synthetic jet stream.

FIG. 20B depicts a mode of operation of the constant suction synthetic jet 511 when the gate valve 523 is opened and fluid flows out through the outer cylindrical section 514. As the fluid goes by the upper rim 515 of the outer cylindrical section 514, vortices 526, 527 are formed, roll up, and move away. Vortices 532, 533, as depicted in FIG. 20B, have already moved a small distance away from the outer surface 513 of the body 512. The vortices 526, 527, 532, 533 entrain ambient fluid 525, as depicted by arrows. Thus, a synthetic jet of fluid 529 is formed approximately normal to the outer surface 513 and moves away from the solid body 512.

Since the upper rim 531 of the inner cylindrical section 516 is slightly below the outer surface 513 of the solid body 512, as fluid is ejected from the outer cylindrical section 514, some of the fluid will be pulled around the upper rim 531 of the inner cylinder 516 and into the fluidic piping 517, as depicted in FIG. 20B. However, because this occurs below the outer surface 513 of the solid body 512, the formation of the vortices 526, 527 and the resulting fluid jet 529 is not affected by the constant suction.

The constant suction synthetic jet actuator 511 alternates between the mode of operation depicted in FIG. 20A and the mode of operation depicted in FIG. 20B. However, as descried above with regard to the synthetic jet actuator 10 depicted in FIGS. 1A–1C, a constant jet of fluid 529 is formed above the opening in the outer surface 513 of the solid body 512.

If it is desired, the fluid source 522 for the outer cylindrical section 514 can be a storage container into which fluid from the ambient air 525 is deposited after being drawn through the inner cylinder 516 by the suction mechanism 518. In this way, zero net mass is injected into the system. This feature may be desirable in some applications. However, the present invention is not limited to such a configuration. Where it does not matter whether any mass is ejected into the system, the source of fluid 522 for the outer cylinder 514 can be any fluidic chamber or environment. In this way, the net mass flow into or out of the synthetic jet actuator of this preferred embodiment can be tailored for the specific application.

The constant suction synthetic jet actuator just described may be used in the applications outlined above for the first preferred embodiment of a synthetic jet actuator 10. For example, a constant suction synthetic jet actuator may be placed next to another constant suction synthetic jet actuator such that one constant suction synthetic jet actuator can vector the other, as shown in FIGS. 26–18B. Operating the valves of two constant suction synthetic jet actuators so-arranged in time harmonic motion of changing phases will yield a result very similar to FIGS. 16A–16G. Additionally, the principles of a constant suction synthetic jet actuator could be embodied in a free-standing cylindrical housing and mounted to a primary jet in order to vector the primary jet. Other applications will be obvious to those with skill in the art and the present invention is intended to include such obvious applications of a constant suction synthetic jet actuator.

We claim:

1. A system for modifying a direction of flow of a primary jet stream of fluid, comprising:
    (a) a synthetic jet actuator having:
        (1) a jet housing defined by walls, said jet housing having an internal chamber with a volume of fluid and an opening in said jet housing connecting said chamber to an external environment having said fluid;
        (2) a volume changing means for periodically changing said volume within said internal chamber so that a series of fluid vortices are generated and projected in said external environment out from said opening of said jet housing; and
        (3) a means for changing a direction of said fluid flowing out from said opening of said jet housing; and
    (b) a synthetic jet stream formed by said fluid vortices, said synthetic jet stream contacting the primary jet stream of fluid, and said direction of said flow of said primary jet stream being modified by said synthetic jet stream.

2. The system of claim 1, wherein said means for changing a direction comprises a flap attached to an exterior surface of one of said walls adjacent to said opening.

3. The system of claim 1, wherein said jet housing comprises a first wall on a first side of said opening and a second wall on a second side of said opening.

4. The system of claim 3, wherein said means for changing a direction comprises said first wall and said second wall in different planes.

5. A method for modifying a direction of flow of a primary jet stream of fluid, comprising the steps of:
    (a) providing said primary jet stream;
    (b) generating a synthetic jet stream that comprises a series of fluid vortices;
    (c) vectoring said synthetic jet stream with a means for changing a direction of said synthetic jet steam; and
    (c) modifying said direction of said primary jet stream by contacting said primary jet stream with said synthetic jet stream.

6. The method of claim 5, wherein said means for changing a direction comprises a flap attached to an exterior surface of one of said walls adjacent to said opening.

7. The method of claim 5, wherein said jet housing comprises a first wall on a first side of said opening and a second wall on a second side of said opening.

8. The method of claim 7, wherein said means for changing a direction comprises said first wall and said second wall in different planes.

9. A synthetic jet actuator, comprising:
    a housing defining an interior chamber and having a first opening in a wall of said housing;
    volume changing means for withdrawing a gas into said chamber and for forcing said gas out of said chamber through said first opening;
    wherein said forcing produces vortex sheets in a flow of said gas forced out of said first opening;
    at least one louver attached to said housing and aligned with a second opening in said housing;
    wherein said one louver permits said gas to flow in only one direction either into said chamber or out of said chamber whereby said one louver is a one-way valve; and
    a continuous synthetic jet stream produced by said vortex sheets.

10. The synthetic jet actuator as set forth in claim 9, wherein said one louver permits said withdrawing means to draw said gas into said chamber through said second opening but blocks said gas flow out of said second opening while said forcing means forces said gas out of said chamber through said first opening.

11. The synthetic jet actuator as set forth in claim 9, wherein said volume changing means comprises a piston reciprocating within said chamber.

12. The synthetic jet actuator as set forth in claim 9, wherein said one louver is an actuated louver, wherein said actuated louver is movable independent of gas flow into said chamber and independent of forcing gas out of said chamber.

13. The synthetic jet actuator as set forth in claim 12, wherein said actuated louver comprises a semi-rigid member for covering said second opening and a piezo-electric material for moving said semi-rigid member away from said second opening upon the application of a control signal, wherein said actuated louver is movable independent of gas flow into said chamber and independent of forcing gas out of said chamber.

14. The synthetic jet actuator as set forth in claim 9, further comprising a second louver aligned with said first opening, said second louver permitting said forcing means to force fluid out of said chamber through said first opening but preventing said withdrawing means from drawing fluid into said chamber through said first opening, said withdrawing means drawing fluid into said chamber through said second opening whereby said synthetic jet actuator pumps fluid from said second opening and out said first opening.

15. The synthetic jet actuator of claim 9, wherein said volume changing means comprises a high frequency means.

16. A method of generating a fluid flow having vortex sheets, comprising the steps of:
   (a) withdrawing fluid into a chamber having an orifice and an opening;
   (b) forcing fluid out of said chamber through said orifice to generate said fluid flow having vortices, said vortices forming vortex sheets;
   (c) forming a continuous synthetic jet stream; and
   (d) selectively opening said opening with a louver so that fluid flows through said opening in only one direction with said one direction being either into said chamber during said withdrawing step or out of said chamber during said forcing step.

17. A method of generating a fluid flow having vortices, comprising the steps of:
   (a) withdrawing fluid into a chamber having an orifice and an opening;
   (b) forcing fluid out of said chamber through said orifice to generate said fluid flow having vortices;
   (c) selectively opening said opening with a louver so that fluid flows through said opening in only one direction with said one direction being either into said chamber during said withdrawing step or out of said chamber during said forcing step;
   (d) providing a primary jet stream;
   (e) generating a synthetic jet stream that comprises a series of fluid vortices; and
   (f) modifying a direction of said primary jet stream by contacting said primary jet stream with said synthetic jet stream.

18. A system for modifying a direction of a flow of a fluidic jet stream, comprising:
   at least two synthetic jets, each having:
      an opening, and
      a means for withdrawing a fluid through said opening and for forcing a fluid out of said opening;
   said opening of each synthetic jet actuator positioned adjacent to one-another such that said fluid out of each synthetic jet travels in parallel; and
   a means for separately controlling said forcing means of said synthetic jet actuators.

19. The system of claim 18, wherein said synthetic jet actuator comprises:
   (a) a jet housing defined by walls, said jet housing having an internal chamber with a volume of fluid and an opening in said jet housing connecting said chamber to an external environment having said fluid; and
   (b) a volume changing means for periodically changing said volume within said internal chamber so that a series of fluid vortices are generated and projected in said external environment out from said opening of said jet housing.

20. The system of claim 19, wherein said volume changing means comprises a flexible diaphragm that serves as a wall of said jet housing, said diaphragm being positioned so that said fluid is moved in and out of said opening during movement of said diaphragm.

21. The system of claim 19, wherein said volume changing means is a piston positioned in said jet housing to move so that said fluid is moved in and out of said opening during reciprocation of said piston.

22. The system of claim 20, wherein said diaphragm comprises a metal layer wherein a metal electrode is disposed adjacent to but spaced from said metal layer so that said diaphragm can be moved via an electrical bias imposed between said electrode and said metal layer.

23. The system of claim 19, wherein said synthetic jet comprises:
   (a) a housing defining an interior chamber and defining said opening in a wall of said housing; and
   (b) at least one louver attached to said housing and aligned with a second opening in said housing;
   wherein said one louver permits fluid flow in only one direction either into said chamber or out of said chamber whereby said one louver is a one-way valve.

24. The system of claim 18, wherein said synthetic jet actuator comprises:
   (a) a first cylindrical section embedded in a solid body with an exit in an outer surface of said solid body;
   (b) a second cylindrical section inside of and concentric to said first cylindrical section, wherein an exit of said second cylindrical section is recessed below said exit of said first cylindrical section;
   (c) a means for supplying a constant suction in said second cylindrical section for drawing an ambient fluid into and through said second cylindrical section; and
   (d) a means for alternately turning on and off a flow of fluid through said first cylindrical section.

25. A synthetic jet actuator comprising:
   (a) a first pipe section embedded in a solid body with an exit in an outer surface of said solid body;
   (b) a second pipe section inside of and concentric to said first pipe section, wherein an exit of said second pipe section is recessed below and concentric to said exit of said first pipe section;
   (c) a means for supplying a constant suction in said second pipe section for drawing an ambient fluid into and through said second pipe section;
   (d) a means for alternately turning on and off a flow of fluid through and out of said exit of said first pipe section; and
   (e) a continuous synthetic jet stream produced by vortex sheets emitted out of said synthetic jet actuator.

26. The synthetic jet actuator of claim 25, wherein said means for alternately turning on and off comprises a gate valve along a fluidic piping connecting said first pipe section and a source of a fluid and a control system for actuating said gate valve to an open and a closed position alternately.

27. The synthetic jet actuator of claim 25, wherein said means for alternately turning on and off a flow of fluid through and out of said exit of said first pipe section is a high frequency means.

28. A synthetic jet actuator comprising:
   (a) a first cylindrical section embedded in a solid body with an exit in an outer surface of said solid body;
   (b) a second cylindrical section inside of and concentric to said first cylindrical section, wherein an exit of said second cylindrical section is recessed below said exit of said first cylindrical section;

(c) a means for supplying a constant suction in said second cylindrical section for drawing an ambient fluid into and through said second cylindrical section;

(d) a means for alternately turning on and off a flow of fluid through and out of said exit of said first cylindrical section;

(e) a synthetic jet stream produced by said synthetic jet actuator; and (f) a primary jet stream of fluid contacting said synthetic jet stream, a direction of said primary jet stream being modified by said synthetic jet stream.

29. A synthetic jet actuator system comprising:

a synthetic jet actuator having a housing defining an interior chamber and having a first opening in a wall of said housing and a volume changing means for withdrawing a gas into said chamber and for forcing said gas out of said chamber through said first opening;

a continuous synthetic jet stream produced by vortex sheets traveling through said first opening of said synthetic jet actuator; and a primary jet stream of fluid contacting said synthetic jet stream, a direction of said primary jet stream being modified by said synthetic jet stream.

30. The synthetic jet actuator system of claim 29, wherein said synthetic jet actuator further comprises:

at least one louver attached to said housing and aligned with a second opening in said housing;

wherein said one louver permits said gas to flow in only one direction either into said chamber or out of said chamber whereby said one louver is a one-way valve.

31. A synthetic jet actuator, comprising:

a housing defining an interior chamber and having an orifice in a wall of said housing;

volume changing means for successively withdrawing fluid into said chamber and for forcing fluid out of said chamber through said orifice, said forcing of fluid out of said chamber generating a train of fluid vortices, said vortices entraining a fluid exterior to said chamber into a fluid stream projecting away from said orifice;

at least one louver attached to said housing and aligned with an opening in said housing;

wherein said one louver permits fluid flow in only one direction either into said chamber or out of said chamber whereby said one louver is a one-way valve; and wherein said one louver permits said volume changing means to force fluid out of said chamber through said opening but blocks fluid flow into said opening while said volume changing means withdraws fluid into said chamber through said orifice.

32. A synthetic jet actuator, comprising:

a housing defining an interior chamber and having an orifice in a wall of said housing;

volume changing means for successively withdrawing fluid into said chamber and for forcing fluid out of said chamber through said orifice, said forcing of fluid out of said chamber generating a train of fluid vortices, said vortices entraining a fluid exterior to said chamber into a fluid stream projecting away from said orifice;

at least one louver attached to said housing and aligned with an opening in said housing; and a second louver aligned with a second opening in said housing;

wherein said one louver permits fluid flow in only one direction either into said chamber or out of said chamber whereby said one louver is a one-way valve.

33. A method of generating a fluid flow having vortices, comprising the steps of:

(a) withdrawing fluid into a chamber having an orifice and an opening;

(b) forcing fluid out of said chamber through said orifice, wherein said forcing creates a train of fluid vortices projecting out from said orifice, said fluid vortices entraining a fluid exterior to said chamber into a synthetic stream; and (c) selectively opening said opening with a louver during said forcing step so that fluid flows out of chamber through said opening during said forcing step.

34. A method of generating a fluid flow having vortices, comprising the steps of:

(a) withdrawing fluid into a chamber having an orifice and an opening;

(b) forcing fluid out of said chamber through said orifice, wherein said forcing creates a train of fluid vortices projecting out from said orifice, said fluid vortices entraining a fluid exterior to said chamber into a synthetic stream; and (c) selectively actively opening said opening with a louver upon the application of a control signal so that fluid flows through said opening in only one direction with said one direction being either into said chamber during said withdrawing step or out of said chamber during said forcing step.

35. A method of generating a fluid flow having vortices, comprising the steps of:

(a) withdrawing fluid into a chamber having an orifice and an opening;

(b) forcing fluid out of said chamber through said orifice to generate vortex sheets projecting from said orifice, said vortex sheets entraining an ambient fluid into a stream of said ambient fluid propagating away from said orifice; and (c) selectively opening said opening with a louver during said withdrawing step;

(d) introducing fluid into said chamber through said opening during said withdrawing step; and (e) opening a second louver aligned with said orifice during said forcing step and closing said louver during said withdrawing step.

* * * * *